United States Patent
Onishi et al.

(10) Patent No.: US 6,825,565 B2
(45) Date of Patent: Nov. 30, 2004

(54) SEMICONDUCTOR DEVICE

(75) Inventors: Yasuhiko Onishi, Nagano (JP); Tatsuji Nagaoka, Nagano (JP); Susumu Iwamoto, Nagano (JP); Takahiro Sato, Nagano (JP)

(73) Assignee: Fuji Electric Co., Ltd., Tokyo (JP)

( * ) Notice: Subject to any disclaimer, the term of this patent is extended or adjusted under 35 U.S.C. 154(b) by 0 days.

(21) Appl. No.: 10/354,890

(22) Filed: Jan. 30, 2003

(65) Prior Publication Data

US 2003/0176031 A1 Sep. 18, 2003

(30) Foreign Application Priority Data

Jan. 30, 2002 (JP) .................................. 2002-021596

(51) Int. Cl.⁷ .............................................. H01L 23/48
(52) U.S. Cl. .................. 257/773; 257/329; 257/330; 257/331; 257/339; 257/340; 438/270
(58) Field of Search ................................ 257/329, 330, 257/331, 339, 340; 438/270

(56) References Cited

U.S. PATENT DOCUMENTS

| 4,754,310 A | 6/1988 | Coe ............................ 357/13 |
| 5,216,275 A | 6/1993 | Chen ........................... 257/493 |
| 5,438,215 A | 8/1995 | Tihanyi ........................ 257/401 |
| 6,174,773 B1 * | 1/2001 | Fujishima .................... 438/270 |

* cited by examiner

Primary Examiner—David Nelms
Assistant Examiner—Mai-Huong Tran
(74) Attorney, Agent, or Firm—Rossi & Associates

(57) ABSTRACT

A semiconductor device includes a drift region, which includes a first alternating conductivity type layer, and a peripheral region, which includes a second alternating conductivity type layer and a third alternating conductivity type layer in the surface portion of the peripheral region. The first layer includes first n-type regions and first p-type regions arranged alternately at a first pitch. The second layer is continuous with the first layer and includes second n-type regions and second p-type regions arranged alternately at the first pitch. The impurity concentration in the second layer is almost the same as the impurity concentration in the first layer. The third layer includes third n-type regions and third p-type regions arranged alternately at a second pitch. The third layer can be doped more lightly than the first and second alternating conductivity type layers. The second pitch can be the same as the first pitch or smaller.

35 Claims, 32 Drawing Sheets

SEMICONDUCTOR DEVICE

BACKGROUND

There exists a tradeoff relation between the on-resistance (current capacity) and the breakdown voltage of the vertical semiconductor device, which includes electrodes distributed on both major surfaces of the semiconductor chip and a vertical drift region, which makes a current flow in the thickness direction of the semiconductor chip. To reduce the tradeoff relation, the vertical drift region has been provided with an alternating conductivity type structure formed of heavily doped vertical n-type regions and heavily doped vertical p-type regions laminated alternately along the major surfaces of the semiconductor chip. The vertical drift region having the alternating conductivity type structure is depleted quickly. In the peripheral region of the semiconductor device, in which substantially no current flows, depletion layers hardly expand outward or into the deep portion of the semiconductor substrate, since the vertical n-type regions and the vertical p-type regions constituting the alternating conductivity type structure in the peripheral region are doped heavily. Due to the heavily doped vertical ntype regions and the heavily doped vertical p-type regions, the electric field strength in the peripheral region soon reaches the critical value for silicon before the applied voltage reaches the designed breakdown voltage of the device. Therefore, the designed breakdown voltage is not obtained.

For obviating the problem described above, it is preferable to provide the peripheral region with an alternating conductivity type structure doped more lightly than the alternating conductivity type structure in the drift region. Alternatively, it is preferable to provide the peripheral region with an alternating conductivity type structure including vertical n-type regions and vertical p-type regions alternately arranged at a pitch of repeating narrower than the pitch of repeating in the drift region.

FIG. 30 is a top plan view of a conventional vertical MOSFET showing the drift region and the peripheral region (breakdown withstanding region) thereof. FIG. 31 is a vertical cross section taken along line 31—31 of FIG. 30. FIG. 32 is a vertical cross section taken along line 32—32 of FIG. 30. Referring now to these figures, the n-channel vertical MOSFET includes an $n^+$-type drain layer (contact layer) 11 with low electrical resistance, a drain electrode 18 on the back surface (second major surface) of the semiconductor chip and in electrical contact with $n^+$-type drain layer 11, a drift region 22 including a first alternating conductivity type layer formed on $n^+$-type drain layer 11, heavily doped p-type base regions (p-type well regions or channel diffusion regions) 13a formed selectively in the surface portion of the drift region 22, a heavily doped $n^+$-type source region 14 formed selectively in the surface portion of the p-type base region 13a, a polysilicon gate electrode layer 16 above the first major surface of the semiconductor chip with a gate insulation film 15 interposed therebetween, and a source electrode 17 in electrical contact with the p-type base regions 13a and the $n^+$-type source regions 14 via contact holes bored through an interlayer insulation film 19a. The $n^+$-type source region 14 is formed shallowly in the p-type base region 13a shaped with a well such that a double-diffusion MOS region constituting the active region of the device is formed. A $p^+$-type contact region 26 is in the p-type base region 13a. Although not shown in the figures, a gate electrode layer 16 is connected to a gate wiring metal film above the gate electrode layer 16.

The first alternating conductivity type layer in drift region 22 includes first n-type regions 22a and first p-type regions 22b. The first n-type regions 22a and the first p-type regions 22b are shaped with respective layers extending vertically in the thickness direction of the semiconductor chip. The first n-type regions 22a and the first p-type regions 22b are laminated alternately along the major surface of the semiconductor chip. The first n-type regions 22a, with the upper ends thereof are in contact with the sandwiched regions 12e between the p-type base regions 13a, provide a substantial current path in the on-state of the device. The lower ends of the first n-type regions 22a are in contact with the $n^+$-type drain layer 11. The upper ends of the first p-type regions 22b are in contact with the well bottoms of the respective p-type base regions 13a. The lower ends of the first p-type regions 22b are in contact with the $n^+$-type drain layer 11.

The n-channel vertical MOSFET includes also a peripheral region 20 between the surface of the semiconductor chip and the $n^+$-type drain layer 11 and surrounding the drift region 22. The peripheral region 20 includes a second alternating conductivity type layer, including second n-type regions 20a and second p-type regions 20b. The second n-type regions 20a and the second p-type regions 20b are shaped with respective layers extending vertically in the thickness direction of the semiconductor chip. The second n-type regions 20a and the second p-type regions 20b are laminated alternately along the major surface of the semiconductor chip. An oxide film (insulation film) 23 made of a thermal oxide or a phosphorus silica glass (PSG) is formed on the second alternating conductivity type layer in the peripheral region 20 for surface protection and for surface stabilization. To facilitate expanding depletion layers in the second alternating conductivity type layer, the second alternating conductivity type layer is doped more lightly than the first alternating conductivity type layer. Alternatively, the second pitch of repeating P2, namely where a pair of the second n-type region 20a and the second p-type region 20b repeat, is narrower than the first pitch of repeating P1, namely where a pair of the first n-type region 22a and the first p-type region 22b repeat.

The vertical MOSFET shown in FIGS. 30 through 32 has the following problems. Since the outermost first n-type region 22aa of the first alternating conductivity type layer in the drift region 22 is in contact with the innermost p-type region 20bb of the second alternating conductivity type layer, the impurity concentration therein are different from the impurity concentration in the first alternating conductivity type layer or the pitch of repeating thereof is different from the pitch of repeating in the first alternating conductivity type layer, causing charge imbalance between the outermost first n-type region 22aa and the innermost p-type region 20bb. Since none of the outermost first n-type region 22aa and the innermost p-type region 20bb is depleted completely in the off-state of the device, electric field localization is formed in the boundary plane X between the first and second alternating conductivity type layers. Therefore, it is difficult to obtain the designed breakdown voltage. Since the charge imbalance between the outermost first n-type region 22aa and the innermost p-type region 20bb causes larger lowering of the breakdown voltage as the alternating conductivity type layers are designed to be thicker for obtaining a vertical semiconductor device of a higher breakdown voltage class, the alternating conductivity type layer formed in the peripheral region of the device for obtaining a higher breakdown voltage does not work as intended.

Accordingly, there is a need for a semiconductor device, including a drift region formed of an alternating conductivity type layer and a peripheral region formed of an alternating conductivity type layer, which facilitates relaxing the surface electric field mainly in the peripheral region so that a higher breakdown voltage and a higher current capacity may be realized. The present invention addresses this need.

SUMMARY OF THE INVENTION

The present invention relates to a vertical power semiconductor structure that is applicable to insulated gate field effect transistors (MOSFET's), conductivity-modulation MOSFET's (IGBT's), bipolar transistors, and such active devices and diodes and such passive devices. Specifically, the present invention relates to vertical power semiconductor devices that can exhibit a high breakdown voltage and a high current capacity.

A semiconductor device according to the present has a semiconductor chip, an active region, a layer with low electrical resistance, a drift region, and a peripheral region. The chip has a first major surface and a second major surface facing opposite to the first major surface. The active region is on the side of the first major surface for actively or passively making current flow. The layer with low electrical resistance can be of a first conductivity type and on the side of the second major surface. The drift region can be between the active region and the layer with low electrical resistance. The drift region provides a vertical drift current path in the ON-state of the semiconductor device and is depleted in the OFF-state of the semiconductor device. The peripheral region is formed around the drift region, between the first major surface and the layer with low electrical resistance. The peripheral region provides substantially no current path in the ON-state of the semiconductor device. The peripheral region is also depleted in the OFF-state of the semiconductor device.

According to one aspect of the present invention, the drift region can have a first alternating conductivity type layer, which can include first regions of the first conductivity type and first regions of a second conductivity type. The first regions can extend perpendicular to the second major surface and are arranged alternately, repeating at a first pitch parallel to the second major surface. The peripheral region can have a second alternating conductivity type layer, which can include second regions of the first conductivity type and second regions of the second conductivity type. The second regions can extend perpendicular to the second major surface and arranged alternately, repeating at the first pitch parallel to the second major surface. The impurity concentration in the second alternating conductivity type layer can be substantially the same as the impurity concentration in the first alternating conductivity type layer. The peripheral region can further include a third alternating conductivity type layer in the surface portion thereof on the side of the first major surface. The third alternating conductivity type layer has third regions of the first conductivity type and third regions of the second conductivity type. The respective third regions can extend perpendicular to the second major surface and arranged alternately parallel to the second major surface, and the impurity concentration in the third alternating conductivity type layer can be lower than the impurity concentration in the first alternating conductivity type layer.

According to another aspect of the present invention, the respective third regions can be arranged alternately, repeating at a second pitch parallel to the second major surface. The second pitch can be narrower than the first pitch.

According to yet another aspect of the present invention, the first alternating conductivity type layer of the drift region can include a first region of the first conductivity type and first regions of the second conductivity type configured as columns standing on lattice points of a first planar polygonal lattice, and repeating at a first pitch, with the first region of the first conductivity type surrounding the first regions of the second conductivity type. Similarly, the second alternating conductivity type layer can include a second region of the first conductivity type and second regions of the second conductivity type configured as columns standing on the lattice points of the first planar polygonal lattice and repeating at a first pitch, with the second region of the first conductivity type surrounding the second regions of the second conductivity type. The impurity concentration in the second alternating conductivity type layer can be substantially the same as the impurity concentration in the first alternating conductivity type layer. Similarly, the third alternating conductivity type layer can include a third region of the first conductivity type and third regions of the second conductivity type configured as columns standing on the lattice points of a second planar polygonal lattice and repeating at a second pitch, with the third region of the first conductivity type surrounding the third regions of the second conductivity type. The second pitch can be narrower than the first pitch.

The first alternating conductivity type layer and the second alternating conductivity type layer can be continuous with each other. The third alternating conductivity type layer can be one half or less as thick as the first alternating conductivity type layer. The third alternating conductivity type layer can be in contact with the first major surface. The third alternating conductivity type layer can extend below the peripheral portion of the active region.

The first regions of the first conductivity type, the first regions of the second conductivity type, the second regions of the first conductivity type, the second regions of the second conductivity type, the third regions of the first conductivity type, and the third regions of the second conductivity type can be configured as stripes extending in a plane parallel to the second major surface.

The direction in which the first regions of the first conductivity type and the first regions of the second conductivity type are arranged alternately can be substantially parallel to or perpendicular to the direction in which the third regions of the first conductivity type and the third regions of the second conductivity type are arranged alternately.

The semiconductor device can further include a channel stopper region of the first conductivity type around the second alternating conductivity type layer and the third alternating conductivity type layer. The channel stopper region can be connected to the layer with low electrical resistance.

The semiconductor device can further include an insulation film covering the third alternating conductivity type layer and a field plate covering at least the inner portion of the third alternating conductivity type layer with the insulation film interposed therebetween.

The semiconductor device can further include one or more rings of the second conductivity type around the active region and on the first major surface side of the third alternating conductivity type layer.

DETAILED DESCRIPTION

In the following descriptions, the letter "n" or "p" indicating the conductivity type of a region or a layer, indicates that the majority carrier is an electron or a hole. The suffix "+" on the right shoulder of the letter "n" or "p" indicating the conductivity type of a layer or a region, indicates that the layer or the region is doped relatively heavily. The suffix "−" on the right shoulder of the letter "n" or "p" indicating the conductivity type of a layer or a region indicates that the layer or the region is doped relatively lightly. Although the first conductivity type is an n-type and the second conductivity type is a p-type in the following descriptions, the invention is applicable also to the semiconductor devices, in which the first conductivity type is a p-type and the second conductivity type is an n-type.

Figure 1:
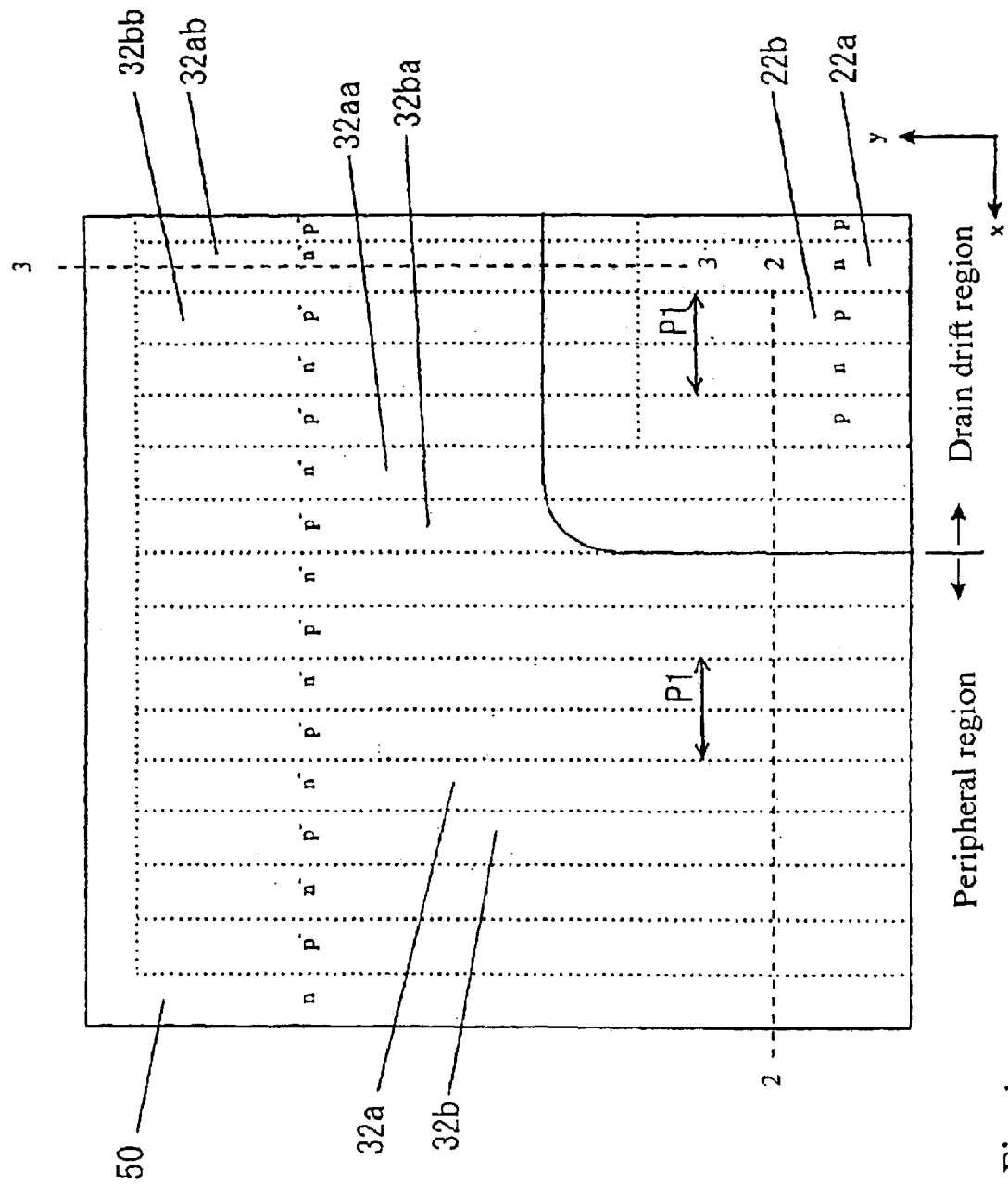
FIG. 1 is a top plan view showing a quarter of the drift region (active region) of a vertical MOSFET according to the first embodiment of the invention.
Figure 2:
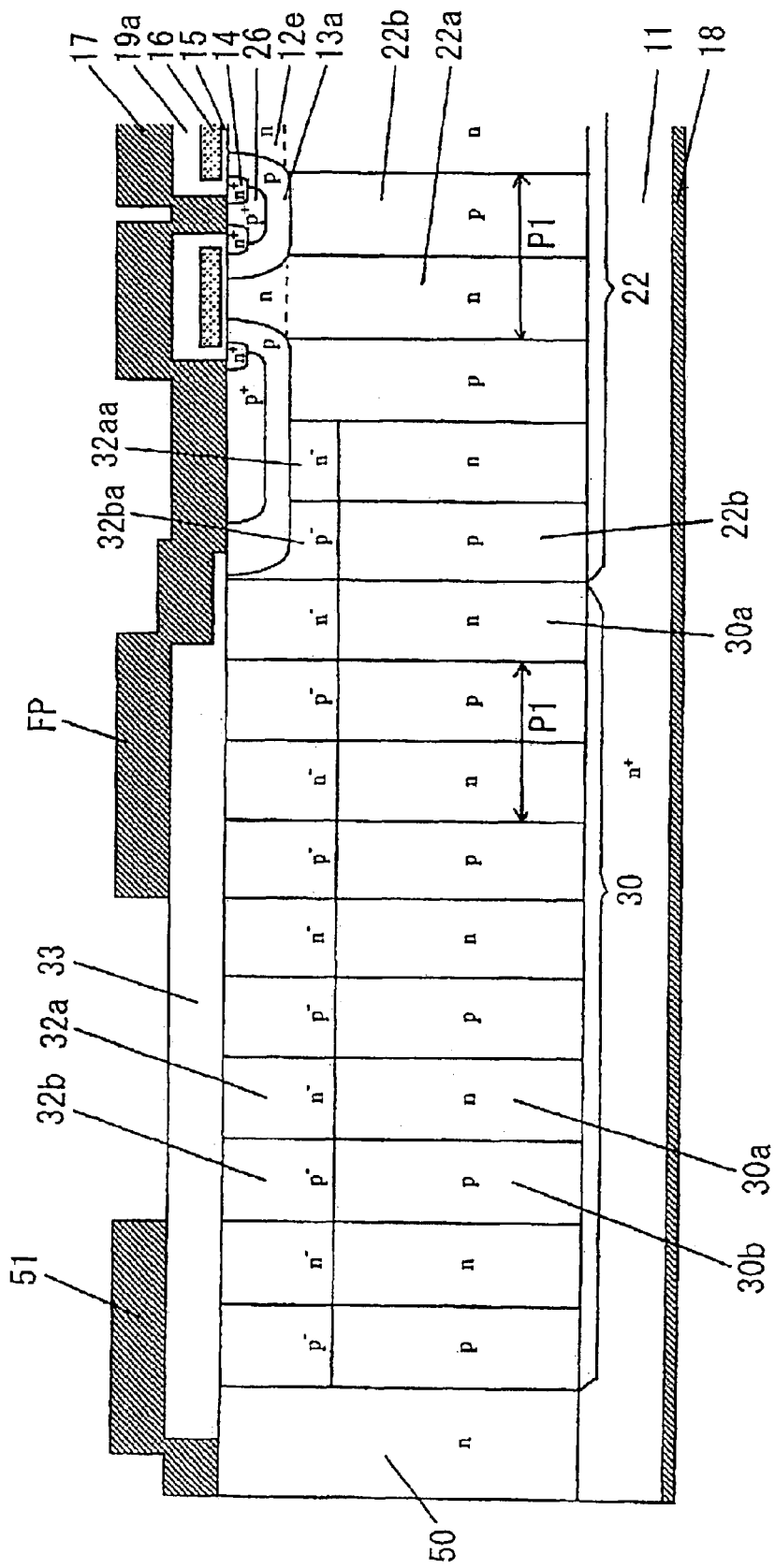
FIG. 2 is a cross section taken along line 2—2 of FIG. 1.
Figure 3:
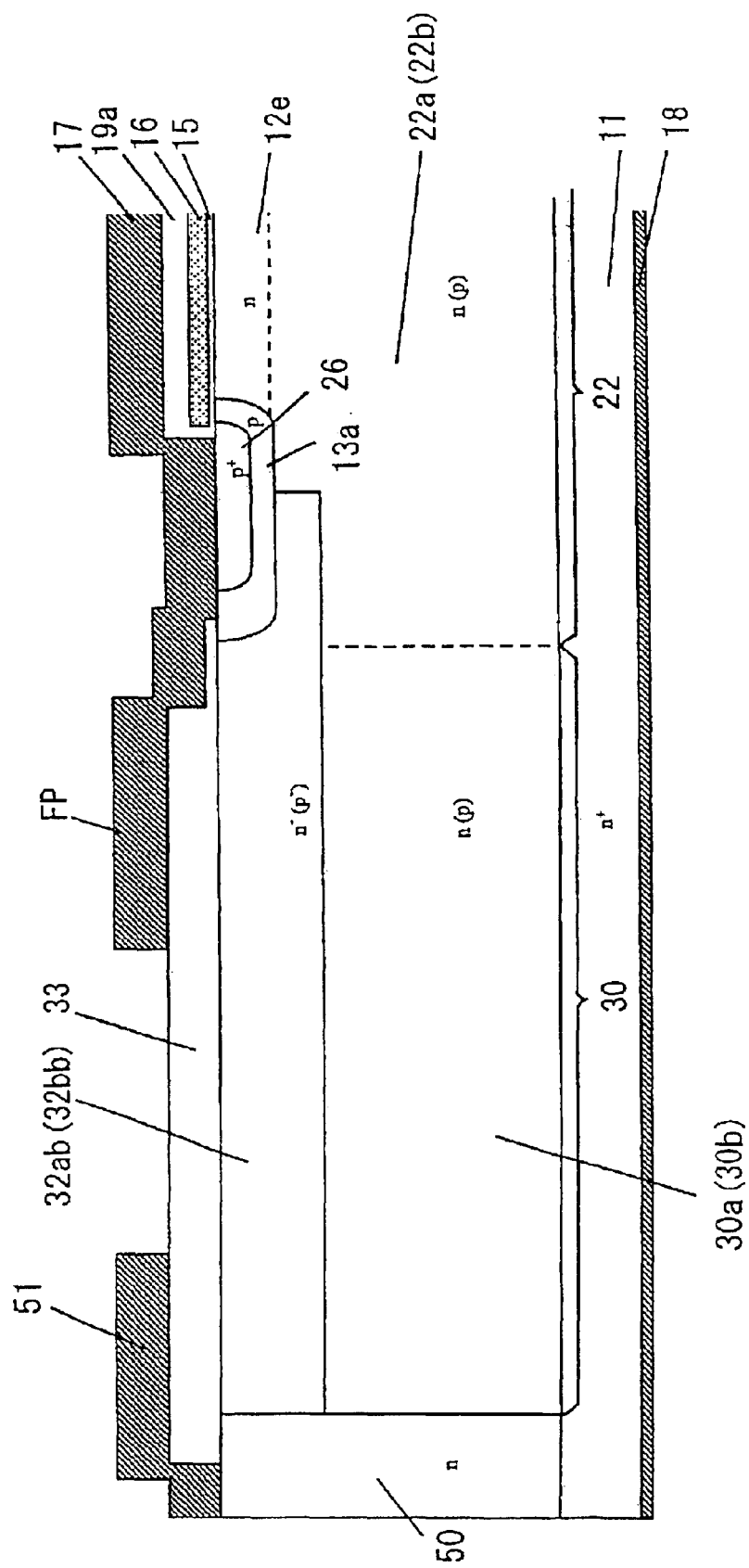
FIG. 3 is a cross section taken along line 3—3 of FIG. 1.

FIG. 1 is a top plan view showing a quarter of the drift region (active region) of a vertical MOSFET according to a first embodiment of the invention. FIG. 2 is a cross section taken along line 2—2 of FIG. 1. FIG. 3 is a cross section taken along line 3—3 of FIG. 1. Referring now to these figures, the vertical MOSFET according to the first embodiment includes an n$^+$-type drain layer (contact layer) 11 with low electrical resistance, a drain electrode 18 on the back surface (second major surface) of the semiconductor chip and in electrical contact with the n$^+$-type drain layer 11, a drift region 22 including a first alternating conductivity type layer formed on the n$^+$-type drain layer 11, heavily doped p-type base regions (p-type well regions) 13a formed selectively in the surface portion of the drift region 22, a heavily doped n$^+$-type source region 14 formed selectively in the surface portion of the p-type base region 13a, a polysilicon gate electrode layer 16 above the first major surface of the semiconductor chip with a gate insulation film 15 interposed therebetween, and a source electrode 17 in electrical contact with the p-type base regions 13a and the n$^+$-type source regions 14 via contact holes bored through an interlayer insulation film 19a. The n$^+$-type source region 14 is formed shallowly in the p-type base region 13a shaped with a well such that a double-diffusion MOS region constituting the active region of the device is formed. A p$^+$-type contact region 26 is formed in the p-type base region 13a. Although not shown in the figures, the gate electrode layer 16 is connected to a gate wiring metal film above the gate electrode layer 16.

The drift region 22 corresponds generally to the portion of the semiconductor chip beneath the p-type base regions 13a working as an active region of the device. The drift region 22 includes first n-type regions 22a and first p-type regions 22b. The first n-type regions 22a and the first p-type regions 22b are shaped with respective layers extending vertically in the thickness direction of the semiconductor chip. The first n-type regions 22a and the first p-type regions 22b are laminated alternately along the major surface of the semiconductor chip with a first repeating pitch P1. The first n-type regions 22a, with the upper ends thereof in contact with sandwiched regions 12e, which is formed between the p-type base regions 13a, provide a current path in the on-state of the device. The first n-type regions 22a, with the upper ends thereof not in contact with the sandwiched regions 12e, provide substantially no current path. The lower ends of the first n-type regions 22a and the first p-type regions 22b are in contact with the n$^+$-type drain layer 11. The upper ends of the first p-type regions 22b are in contact with the well bottoms of the respective p-type base regions 13a.

The n-channel vertical MOSFET includes also a peripheral region 30 surrounding the drift region 22. The peripheral region 30 includes a second alternating conductivity type layer on the n+-type drain layer 11 and a third alternating conductivity type layer on the second alternating conductivity type layer. The third alternating conductivity type layer is on the first major surface side of the semiconductor chip. The second alternating conductivity type layer includes second n-type regions 30a and second p-type regions 30b. The second n-type regions 30a and the second p-type regions 30b are shaped with respective layers extending vertically in the thickness direction of the semiconductor chip. The second n-type regions 30a and the second p-type regions 30b are laminated alternately along the major surface of the semiconductor chip with the repeating pitch P1, which is the same repeating pitch of the first alternating conductivity type layer. The impurity concentration in the second alternating conductivity type layer in the peripheral region 30 is almost the same as that of the first alternating conductivity type layer in the drift region 22. The third alternating conductivity type layer includes third n⁻-type regions 32a and third p⁻-type regions 32b. The third n⁻-type regions 32a and the third p⁻-type regions 32b are shaped with respective layers having the same thickness as the thickness of the second n-type regions 30a and the second p-type regions 30b. The third n⁻-type regions 32a and the third p⁻-type regions 32b extend vertically in the thickness direction of the semiconductor chip and are laminated alternately along the major surface of the semiconductor chip at the pitch P1 such that the third n⁻-type regions 32a are aligned with and on the second n-type regions 30a and the third p⁻-type regions 32b are aligned with and on the second p-type regions 30b.

In the planar arrangement, the regions in the first, second and third alternating conductivity type layers are shaped with respective stripes extending parallel to each other. A third p⁻-type region 32ba and a third n⁻-type region 32aa adjacent to and extending parallel to the first alternating conductivity type layer extend below the outermost p-type base region 13a. The third p⁻-type regions 32bb and the third n⁻-type regions 32ab, with the end faces thereof in contact with the end faces of the first n-type regions 22a and the first p-type regions 22b, respectively, also extend below the p-type base regions 13a.

An oxide film (insulation film) 33 is formed on the third alternating conductivity type layer such that the oxide film 33 becomes thicker from drift region 22 toward the peripheral region 30 in a stepwise manner. A field plate FP extends from the source electrode 17 onto the oxide film 33 such that the field plate FP covers part of the third alternating conductivity type layer. An n-type channel stopper region 50 is formed around the peripheral region 30. A stopper electrode 51, which is connected electrically to the n-type channel stopper region 50, is on the first major surface side of the n-type channel stopper region 50.

The vertical MOSFET according to the first embodiment can be of the 600 V class. Exemplary dimensions and the impurity concentrations of the constituent layers and regions follow. The drift region 22 is 44.0 μm thick. The first n-type regions 22a and the first p-type regions 22b are 8.0 μm wide, respectively. Therefore, the pitch P1 is 16.0 μm. The impurity concentration in the first alternating conductivity type layer is $2.4 \times 10^{15}$ cm⁻³. The second alternating conductivity type layer in the peripheral region 30 is 31.0 μm thick. The second n-type regions 30a and the second p-type regions 30b are 8.0 μm wide, respectively. Therefore, the pitch P1 of the second alternating conductivity type layer is 16.0 μm. The impurity concentration in the second alternating conductivity type layer is $2.4 \times 10^{15}$ cm⁻³. The third alternating conductivity type layer in the peripheral region 30 is 13.0 μm thick. The n-type regions 32a and the p-type regions 32b are 8.0 μm wide, respectively. The impurity concentration in the third alternating conductivity type layer is $2.4 \times 10^{14}$ cm⁻³. The diffusion depth of p-type base regions 13a is 3.0 μm. The surface impurity concentration of the p-type base regions 13a is $3.0 \times 10^{17}$ cm⁻³. The diffusion depth of n+-type source region 14 is 1.0 μm. The surface impurity concentration of the n+-type source region 14 is $3.0 \times 10^{20}$ cm⁻³. The diffusion depth of the sandwiched region 12e, which works as a surface drift region, is 2.5 μm. The surface impurity concentration of the sandwiched region 12e is $2.0 \times 10^{16}$ cm⁻³. The n+-type drain layer 11 is 300 μm thick. The impurity concentration in the n+-type drain layer 11 is $2.0 \times 10^{18}$ cm⁻³. The n-type channel stopper region 50 is 30.0 μm wide. The impurity concentration in the n-type channel stopper region 50 is $6.0 \times 10^{15}$ cm⁻³.

When the peripheral region 30 is formed only of the third alternating conductivity type layer, a charge imbalance will be formed inevitably across the boundary between the first p-type region 22b and the third n⁻-type region 32a, further drastically lowering the breakdown voltage, since the impurity concentration in the third alternating conductivity type layer is lower than that in the first alternating conductivity type layer. When a charge balance is maintained, the electric field distribution is almost flat across the thickness direction (depth direction) of the alternating conductivity type layers. When the charge imbalance is present, the electric field is distributed along a gradient in the thickness direction (depth direction) of the alternating conductivity type layers. When the third alternating conductivity type layer is thicker, the breakdown voltage is lowered even further, since it forms a large charge imbalance. However, the impurity concentrations in the first and second alternating conductivity type layers are almost the same in the vertical MOSFET according to the first embodiment. Moreover, the junction depth between the first p-type regions 22b of the first alternating conductivity type layer and the second n-type regions 30a of the second alternating conductivity type layer in contact with the respective first p-type regions 22b is long. Moreover, the third alternating conductivity type layer on the first major surface side is thin. Since the charge imbalance is formed only across the boundary between the first and third alternating conductivity type layers, the charge amount imbalance is small and the lowering of the breakdown voltage is suppressed to a minimum. Moreover, the vertical MOSFET according to the first embodiment facilitates to secure the designed breakdown voltage as the surface electric field is relaxed and the depletion layers expand easily in the surface portion of the third alternating conductivity type layer due to the low impurity concentration in the third alternating conductivity type layer. Since the thick insulation film 33 shares the breakdown voltage, a higher breakdown voltage is obtained. The repeating pitch of the third alternating conductivity type layer is set at the same value as the pitches of the first and second alternating conductivity type layers according to the first embodiment, since the impurity concentration in the third alternating conductivity type layer is low. However, the pitch of the third alternating conductivity type layer has no limitation as long as the depletion layers can expand easily in the third alternating conductivity type layer.

In the Y-direction, the n⁻-type regions 32ab and the p⁻-type regions 32bb are between the n-type channel stopper region 50 and the p-type base region 13a. Since the n⁻-type regions 32ab and the p⁻-type regions 32bb are reverse biased in the off-state of the device, almost no breakdown voltage lowering is caused.

According to the first embodiment, a p⁻-type region 32ba and an n⁻-type region 32aa extend below the peripheral portion of the p-type base region 13a. Due to this configuration, the electric field localization below the peripheral portion of the p-type base region 13a is relaxed. Since the field plate FP covers the third alternating conductivity type layer with a thick insulation film 33 interposed therebetween, the depletion layers in the surface portion of the third alternating conductivity type layer are controllable and a higher breakdown voltage is obtained. A guard ring or guard rings may be added with no problem. The n-type channel stopper region 50 and the stopper electrode 51 facilitate to control the leakage current.

Figure 4:
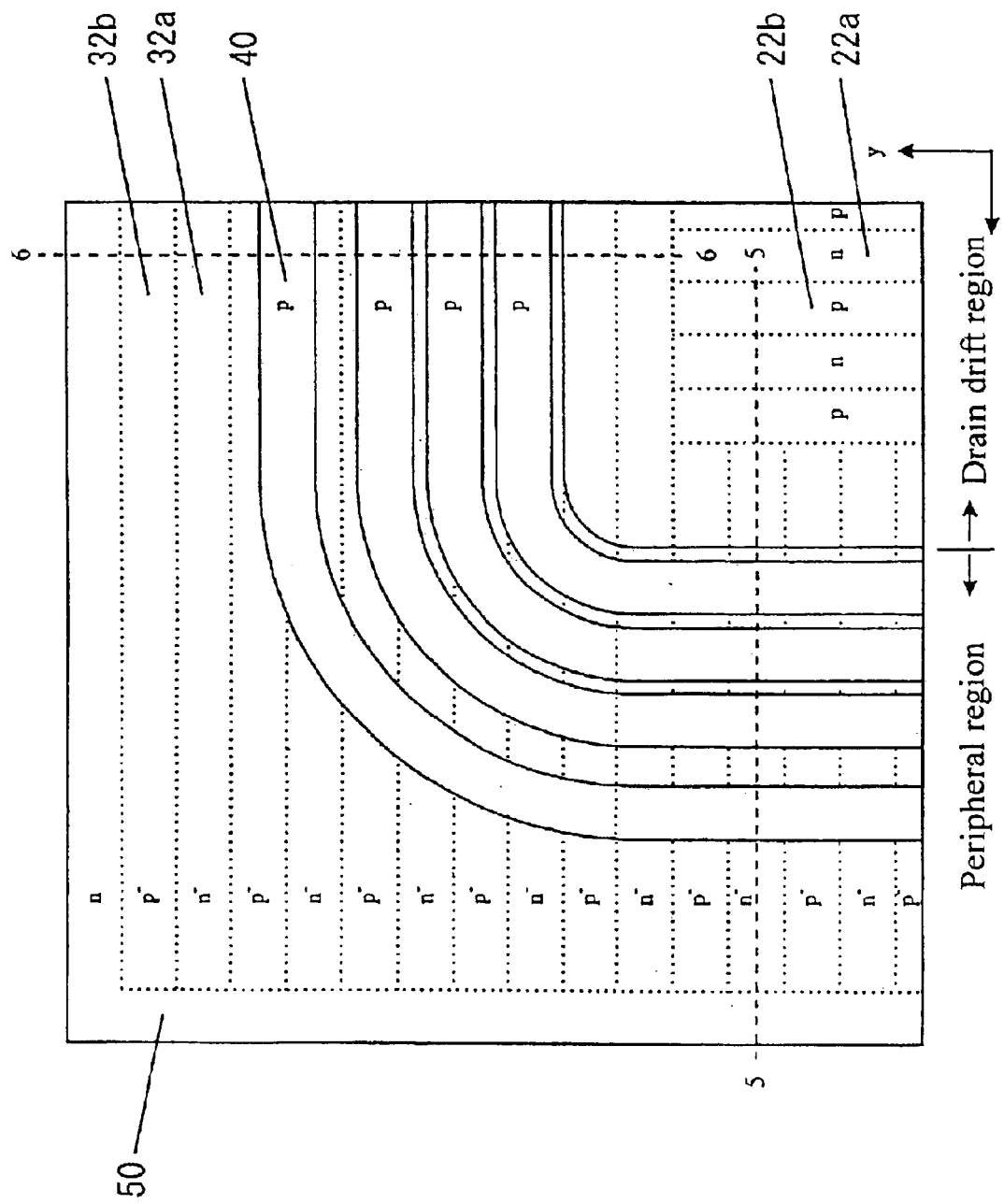
FIG. 4 is a top plan view showing a quarter of the drift region (active region) of a vertical MOSFET according to the second embodiment of the invention.
Figure 5:
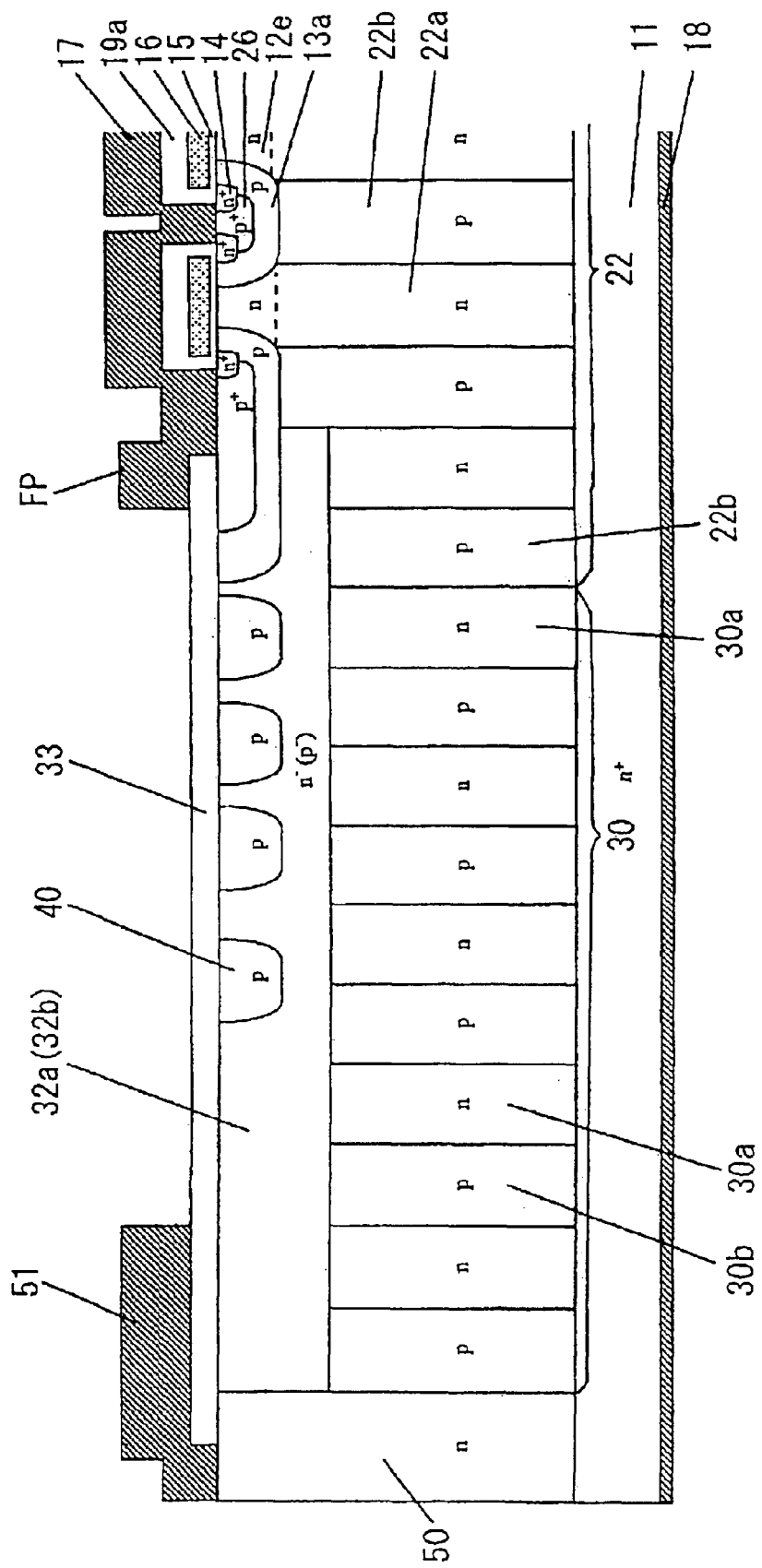
FIG. 5 is a cross section taken along line 5—5 of FIG. 4.
Figure 6:
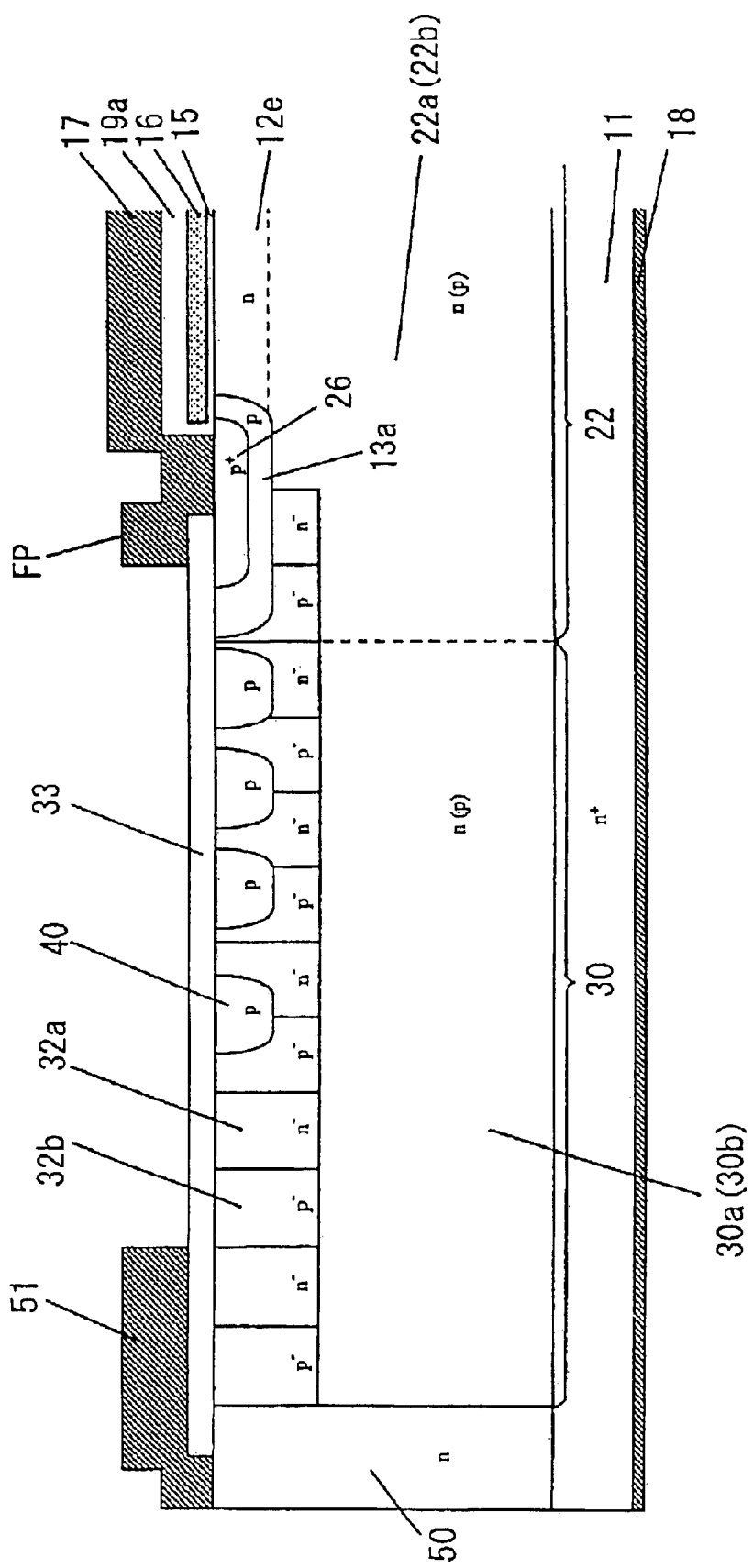
FIG. 6 is a cross section taken along line 6—6 of FIG. 4.

FIG. 4 is a top plan view showing a quarter of the drift region (active region) of a vertical MOSFET according to a second embodiment of the invention. FIG. 5 is a cross section taken along line 5—5 of FIG. 4. FIG. 6 is a cross section taken along line 6—6 of FIG. 4. Referring now to these figures, the vertical MOSFET according to the second embodiment includes a drift region 22, including a first alternating conductivity type layer and a peripheral region 30, including a second alternating conductivity type layer and a third alternating conductivity type layer in the same manner as the vertical MOSFET according to the first embodiment. However, the vertical MOSFET according to the second embodiment is different from the vertical MOSFET according to the first embodiment in that the third n-type regions 32a and the third p-type regions 32b in the peripheral region 30 extend, in the planar arrangement, perpendicular to the first n-type regions 22a and the first p-type regions 22b in the drift region 22 according to the second embodiment. In other words, the direction in which the third n-type regions 32a and the third p-type regions 32b are alternately arranged is almost perpendicular to the direction in which the first n-type regions 22a and the first p-type regions 22b are alternately arranged in the vertical MOSFET according to the second embodiment. The vertical MOSFET according to the second embodiment is also different from the vertical MOSFET according to the first embodiment in that the vertical MOSFET according to the second embodiment includes a plurality of p-type guard rings 40 surrounding the p-type base regions 13a. As long as the lightly doped third alternating conductivity type layer is much thinner than the first alternating conductivity type layer, whether the third n-type regions 32a and the third p-type regions 32b in the peripheral region 30 extend perpendicular or parallel to the first n-type regions 22a and the first p-type regions 22b in the drift region 22 does not pose any major problem. Further, one or more field plates, like FIG. 1, can be jointly formed besides the p-type guard rings 40.

The configuration according to the second embodiment facilitates to prevent formation of charge imbalance across the boundary between the first alternating conductivity type layer and the peripheral region 30 and to expand depletion layers in the surface portion of the peripheral region 30 in the same manner as the configuration according to the first embodiment. The configuration according to the second embodiment is advantageous in that it increases the design freedom.

Figure 7:
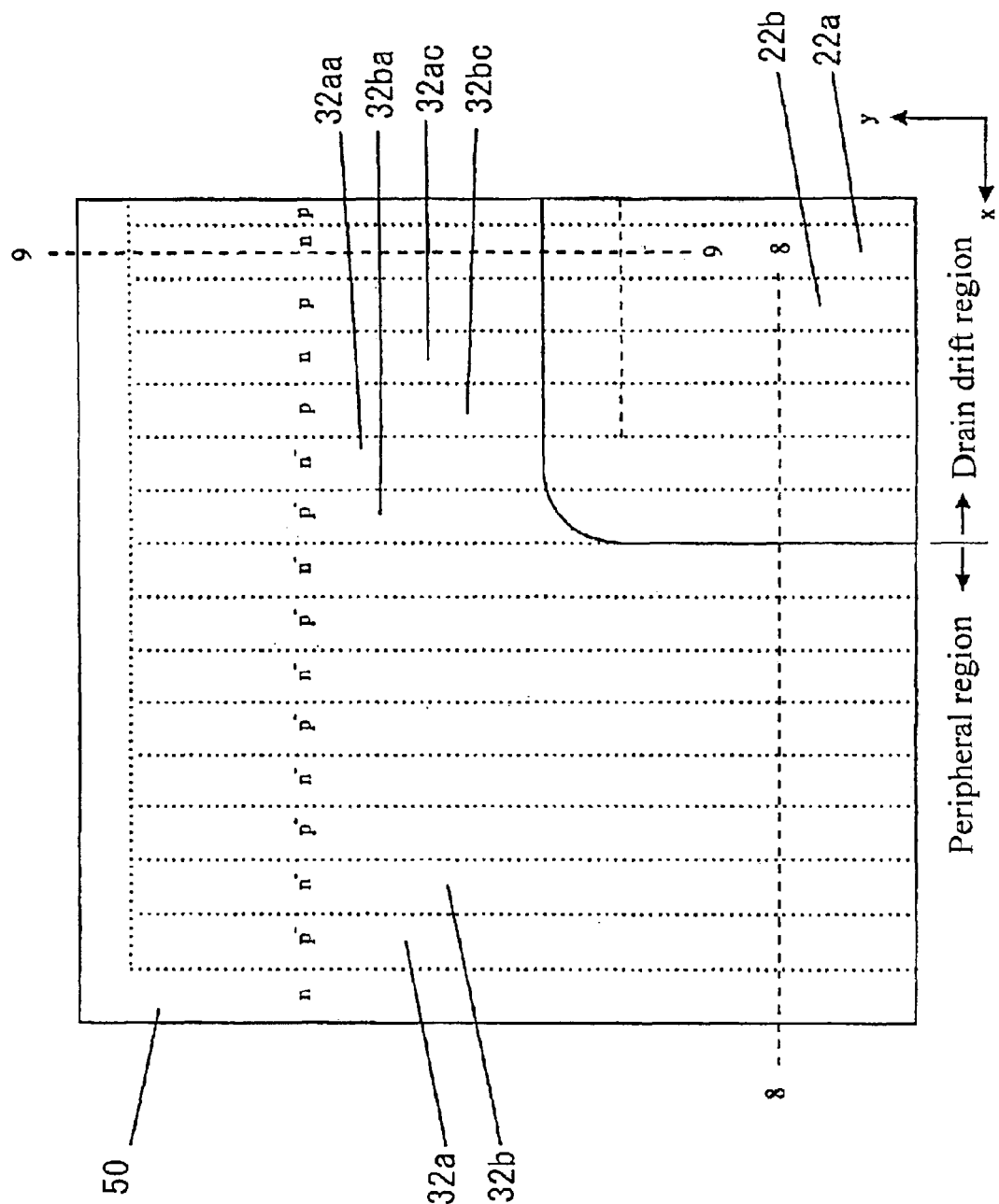
FIG. 7 is a top plan view showing a quarter of the drift region (active region) of a vertical MOSFET according to the third embodiment of the invention.
Figure 8:
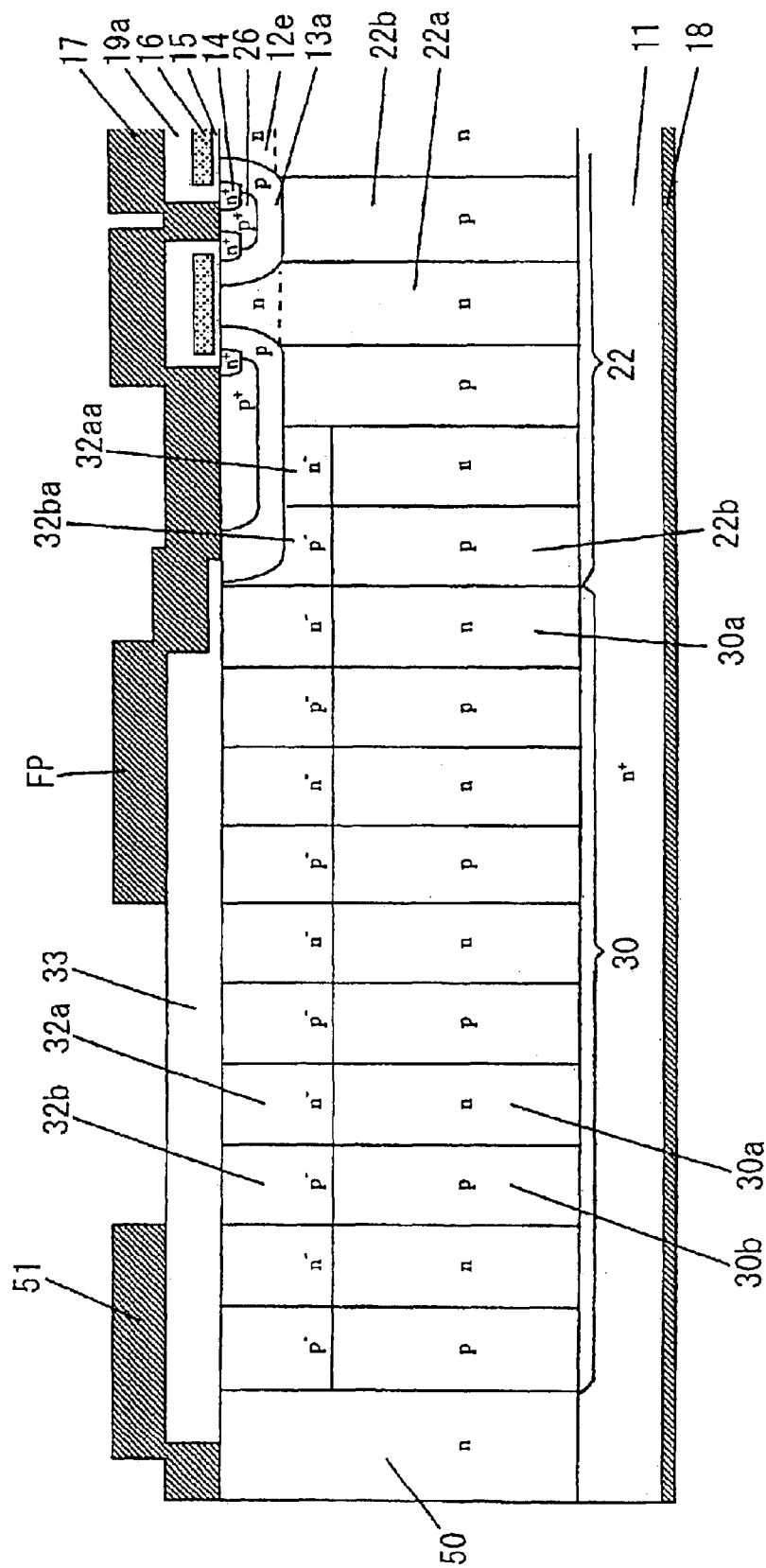
FIG. 8 is a cross section taken along line 8—8 of FIG. 7.
Figure 9:
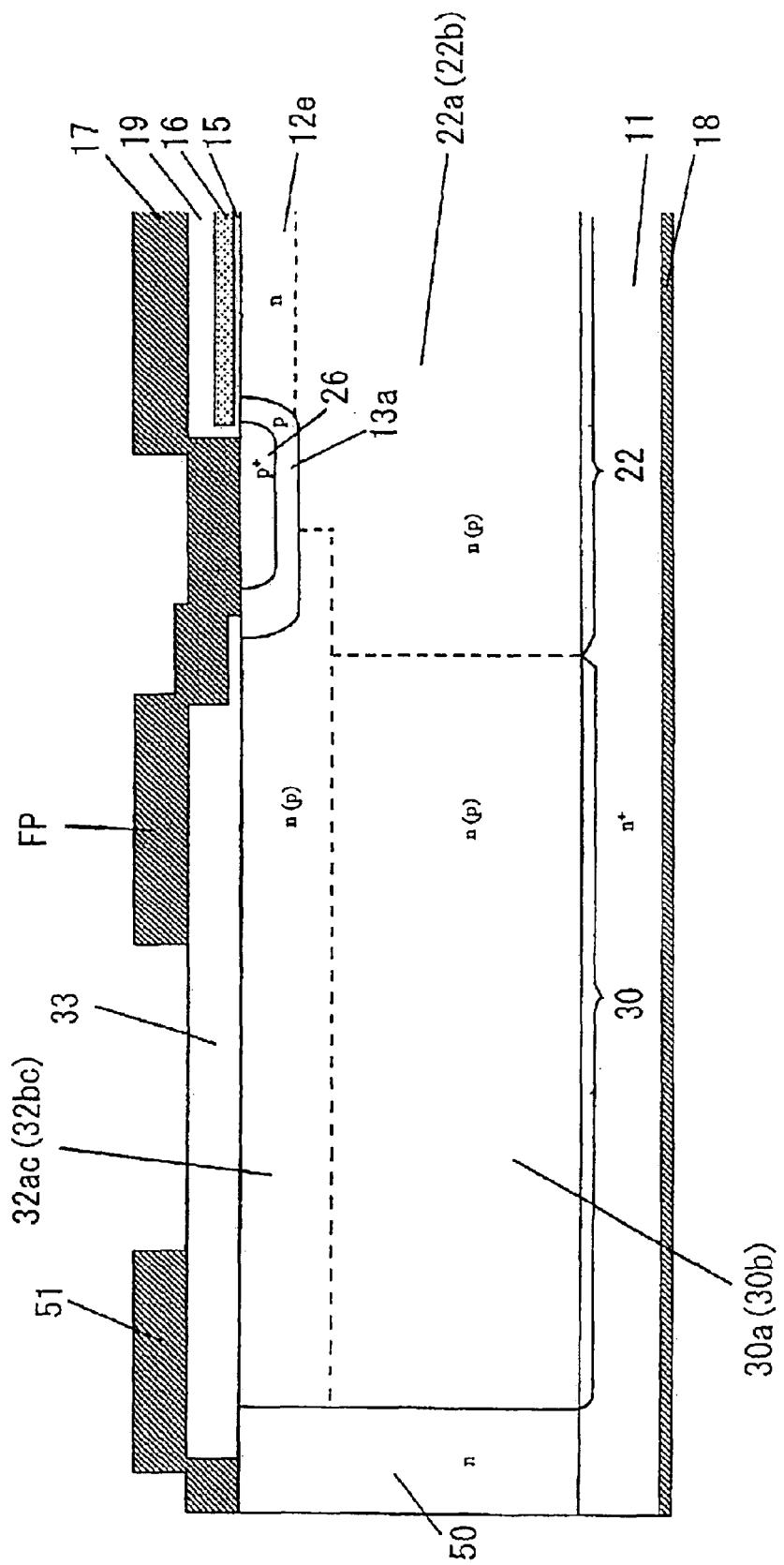
FIG. 9 is a cross section taken along line 9—9 of FIG. 7.

FIG. 7 is a top plan view showing a quarter of the drift region (active region) of a vertical MOSFET according to a third embodiment of the invention. FIG. 8 is a cross section taken along line 8—8 of FIG. 7. FIG. 9 is a cross section taken along line 9—9 of FIG. 7. Referring now to these figures, the vertical MOSFET according to the third embodiment includes a third alternating conductivity type layer including n-type regions 32ac and p-type regions 32bc extending in the Y-direction from the first n-type regions 22a and the p-type regions 22b of the first conductivity type layer, respectively. The n-type regions 32ac and the p-type regions 32bc are not doped more lightly than the first n-type regions 22a and the p-type regions 22b, but doped at almost the same extent as the first alternating conductivity type layer. The n-type regions 32ac and the p-type regions 32bc are sandwiched between an n-type channel stopper region 50 biased at the drain potential and the p-type base regions 13a biased at the source potential. Therefore, the n-type regions 32ac and the p-type regions 32bc, although not doped lightly, sustain the breakdown voltage due to sure depletion layer expansion into the n-type regions 32ac and the p-type regions 32bc. Thus, it is not necessary to completely surround the p-type base regions 13a as an active region of the device by the surface portion of the peripheral region 30 doped lightly. Since the boundary, across which the impurity concentration changes, is flat in the configuration according to the third embodiment, this configuration is advantageous to design vertical MOSFET's easily.

Figure 10:
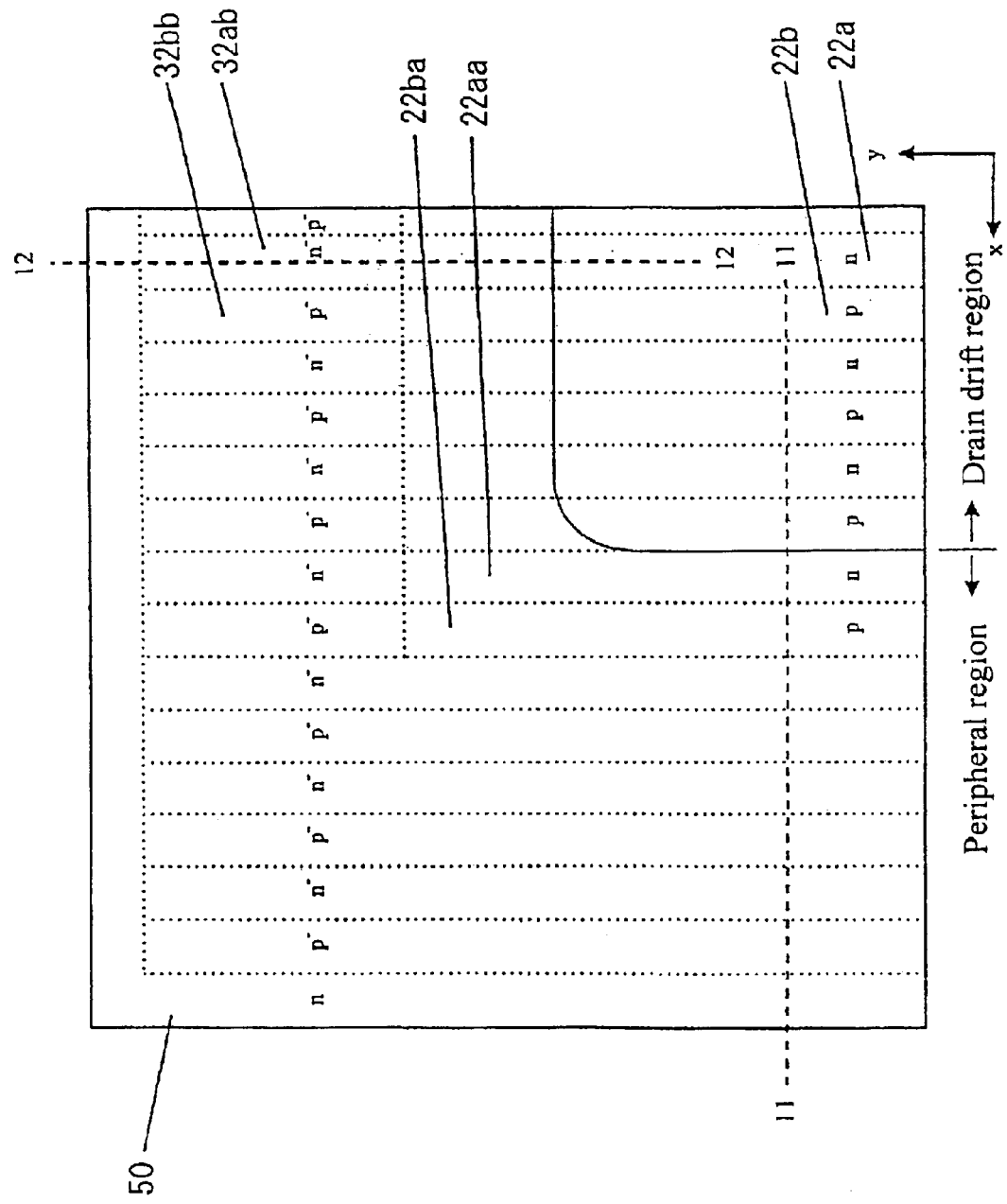
FIG. 10 is a top plan view showing a quarter of the drift region (active region) of a vertical MOSFET according to the fourth embodiment of the invention.
Figure 11:
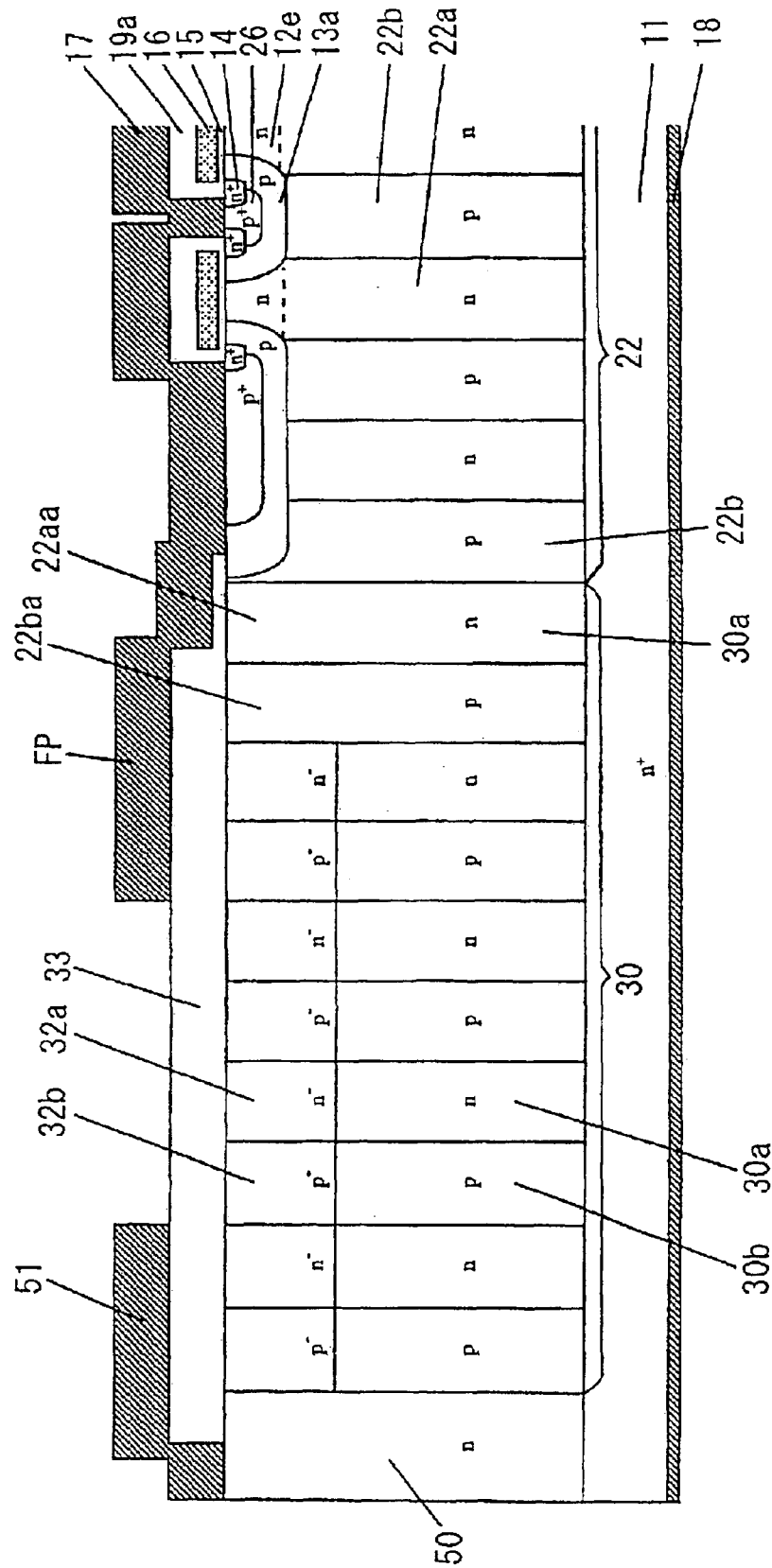
FIG. 11 is a cross section taken along line 11—11 of FIG. 10.
Figure 12:
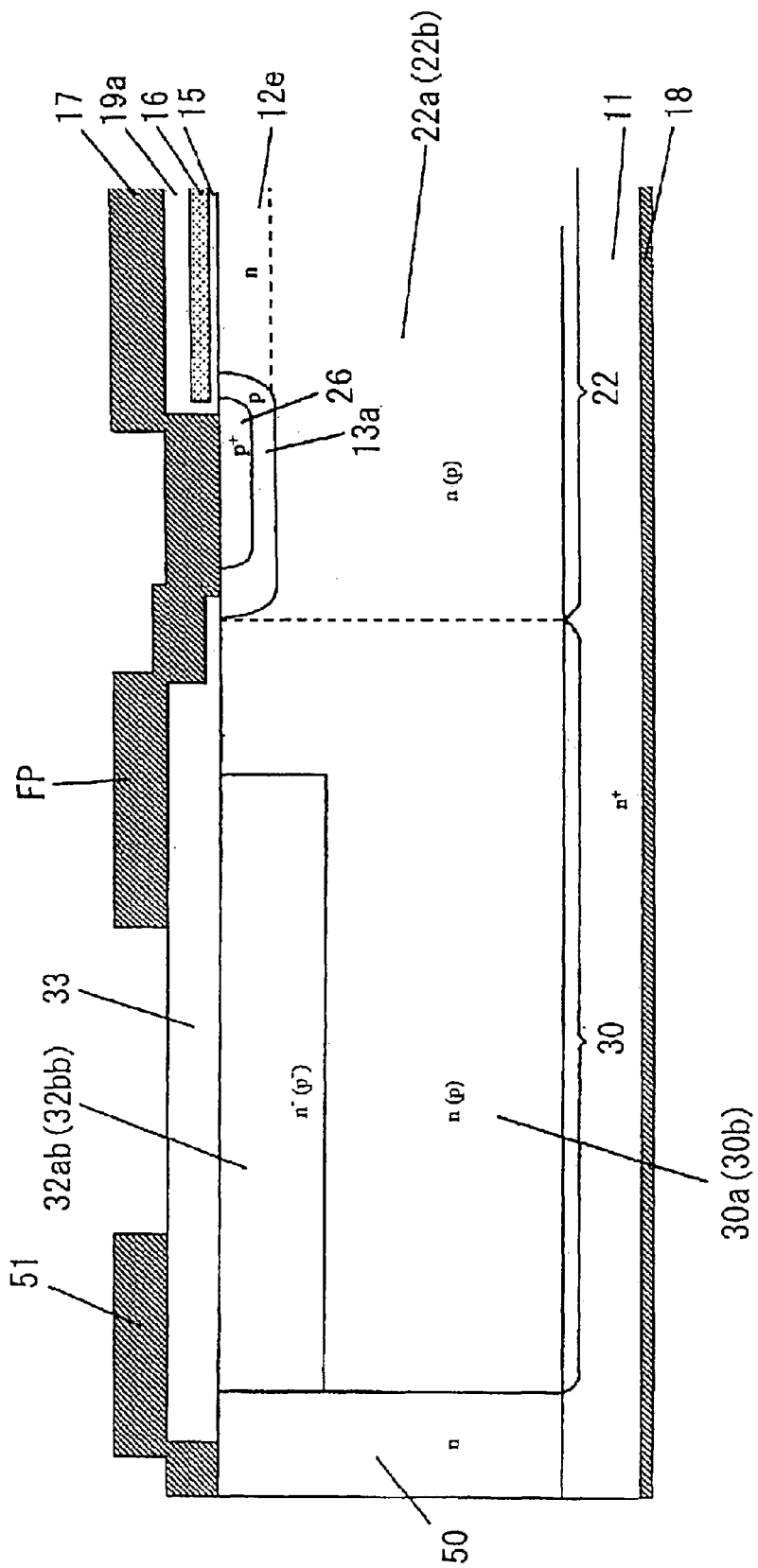
FIG. 12 is a cross section taken along line 12—12 of FIG. 10.

FIG. 10 is a top plan view showing a quarter of the drift region (active region) of a vertical MOSFET according to a fourth embodiment of the invention. FIG. 11 is a cross section taken along line 11—11 of FIG. 10. FIG. 12 is a cross section taken along line 12—12 of FIG. 10. The vertical MOSFET according to the fourth embodiment is a modification of the vertical MOSFET according to the first embodiment. The vertical MOSFET according to the fourth embodiment is different from the vertical MOSFET according to the first embodiment in that the first alternating conductivity type layer in the drain drift layer 22 extends outward from beneath the outermost p-type base region 13a, in that the third alternating conductivity type layer in the surface portion of the peripheral region 30 is not in contact with any p-type base region 13a, and in that a field plate FP covering a first n-type region 22aa and a first p-type region 22ba in the extended portion of (adjacent to) the first alternating conductivity type layer and the third alternating conductivity type layer is formed on a thick oxide film 33.

When a field plate extends above the lightly doped third alternating conductivity type layer over the boundary between the first alternating conductivity type layer in the drift region 22 and the third alternating conductivity type layer, across which the impurity concentration changes, the voltage at which the lightly doped third alternating conductivity type layer should sustain is reduced by the voltage at which the field plate sustains. In other words, even when there is charge imbalance across the impurity concentration boundary, a breakdown voltage equivalent to the breakdown voltage in the state of charge balance will be obtained as long as the breakdown voltage lowering caused by the charge imbalance is smaller than the voltage sustained by the field plate FP. Moreover, the breakdown voltage lowering due to the charge imbalance is reduced, since the third alternating conductivity type layer is thinner than the first alternating conductivity type layer. Therefore, the configuration according to the fourth embodiment facilitates to reduce the breakdown voltage lowering when charge imbalance is formed. The breakdown voltage lowering in the vertical MOSFET according to the fourth embodiment is smaller than that in the vertical MOSFET according to the first embodiment.

The direction, in which the third n-type regions and the third p-type regions in the third alternating conductivity type layer are arranged alternately, may be parallel to or perpendicular to the direction, in which the first n-type regions and the first p-type regions in the first alternating conductivity type layer are arranged alternately. The field plate FP extends directly from the source electrode 17 according to the fourth embodiment. Alternatively, the field plate FP and the source electrode 17 can be formed separately with an interlayer insulation film interposed therebetween.

Figure 13:
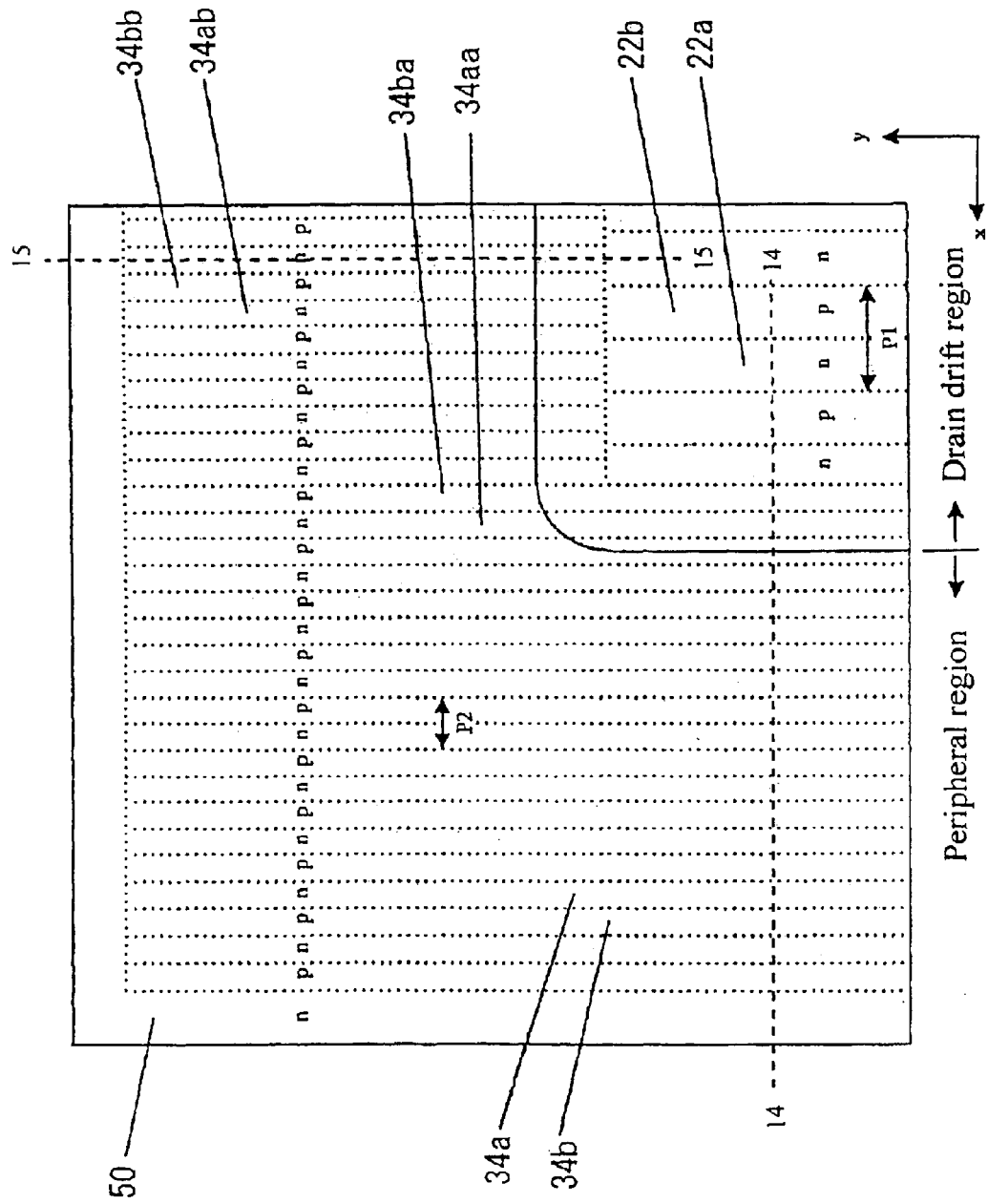
FIG. 13 is a top plan view showing a quarter of the drift region (active region) of a vertical MOSFET according to the fifth embodiment of the invention.
Figure 14:
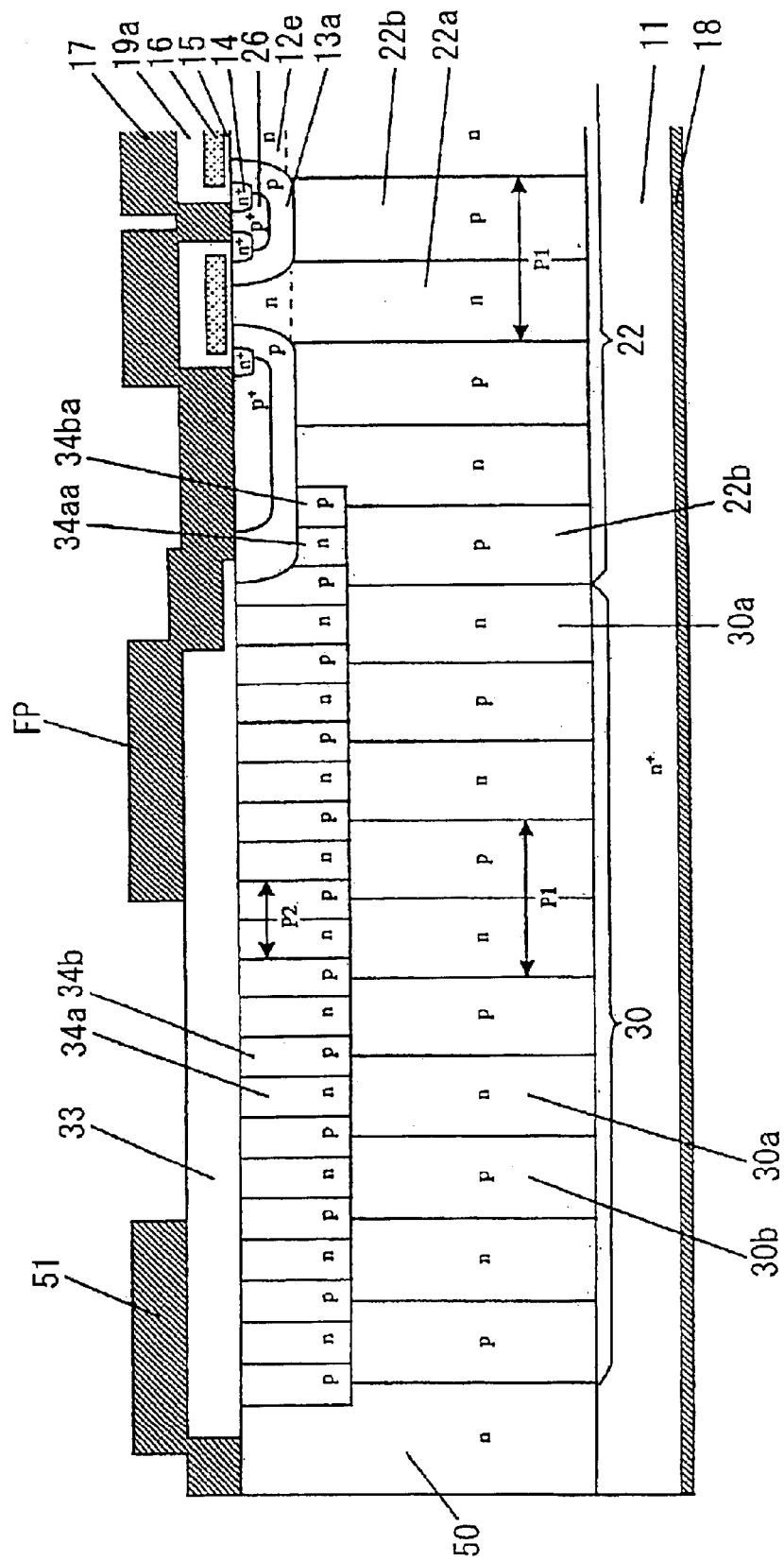
FIG. 14 is a cross section taken along line 14—14 of FIG. 13.
Figure 15:
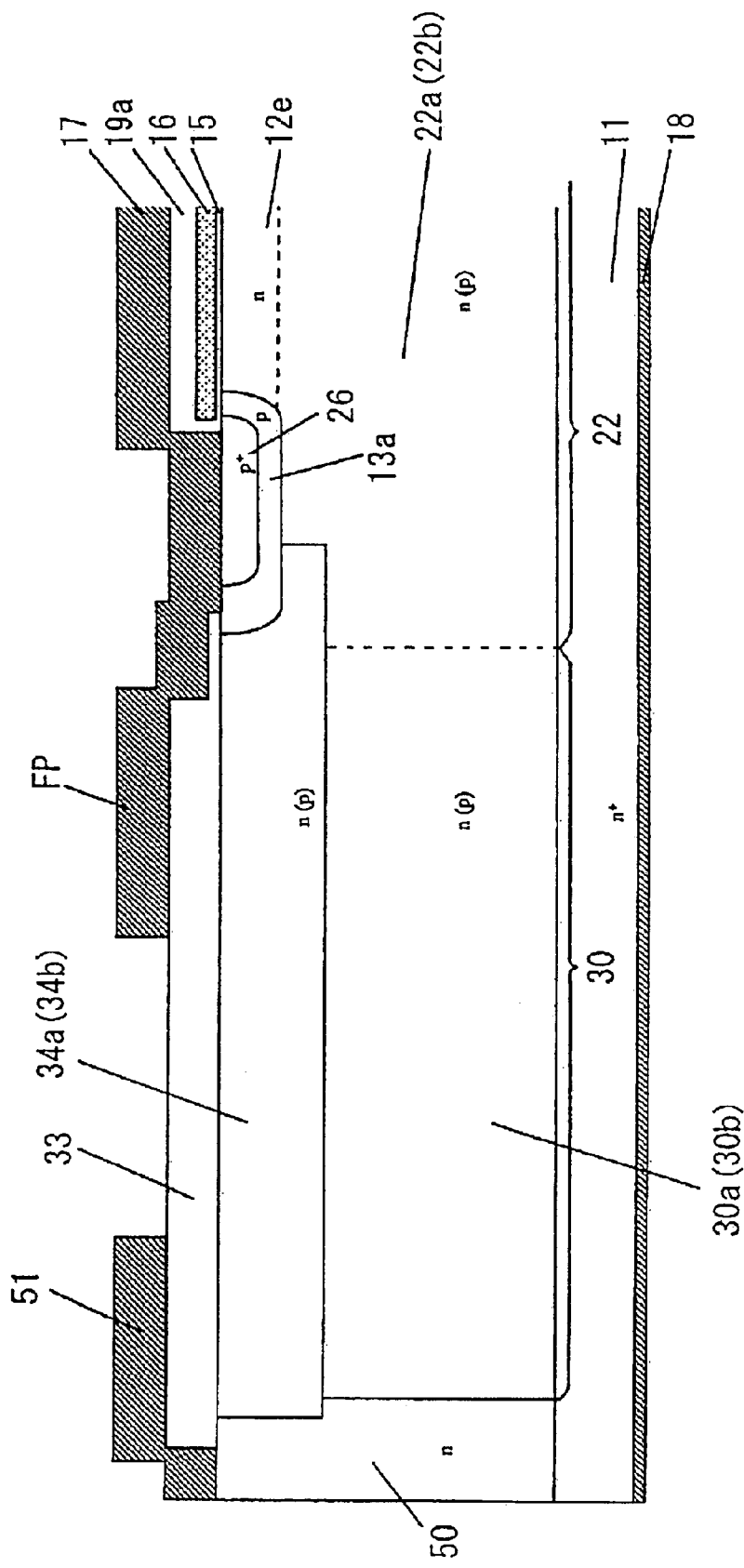
FIG. 15 is a cross section taken along line 15—15 of FIG. 13.

FIG. 13 is a top plan view showing a quarter of the drift region (active region) of a vertical MOSFET according to a fifth embodiment of the invention. FIG. 14 is a cross section taken along line 14—14 of FIG. 13. FIG. 15 is a cross section taken along line 15—15 of FIG. 13.

Referring now to these figures, the vertical MOSFET according to the fifth embodiment includes an n$^+$-type drain layer (contact layer) 11 with low electrical resistance, a drain electrode 18 on the back surface (second major surface) of the semiconductor chip and in electrical contact with the n$^+$-type drain layer 11, a drift region 22, including a first alternating conductivity type layer formed on the n$^+$-type drain layer 11, heavily doped p-type base regions (p-type well regions) 13a formed selectively in the surface portion of the drift region 22, a heavily doped n$^+$-type source region 14 formed selectively in the surface portion of the p-type base region 13a, a polysilicon gate electrode layer 16 above the first major surface of the semiconductor chip with a gate insulation film 15 interposed therebetween, and a source electrode 17 in electrical contact with the p-type base regions 13a and the n$^+$-type source regions 14 via contact holes bored through an interlayer insulation film 19a. The n$^+$-type source region 14 is formed shallowly in the p-type base region 13a shaped with a well such that a double-diffusion MOS region constituting the active region of the device is formed. A p$^+$-type contact region 26 is in the p-type base region 13a. Although not shown in the figures, the gate electrode layer 16 is connected to a gate wiring metal film above the gate electrode layer 16.

The drift region 22 substantially corresponds to the portion of the semiconductor chip beneath the p-type base regions 13a working as an active region of the device. The drift region 22 includes first n-type regions 22a and first p-type regions 22b. The first n-type regions 22a and the first p-type regions 22b are shaped with respective layers extending vertically in the thickness direction of the semiconductor chip. The first n-type regions 22a and the first p-type regions 22b are laminated alternately along the major surface of the semiconductor chip at a first repeating pitch P1. The first n-type regions 22a, with the upper ends thereof in contact with the sandwiched regions 12e between the p-type base regions 13a, provide a current path in the on-state of the device. The first n-type regions 22a, with the upper ends thereof not in contact with the sandwiched region 12e, provide substantially no current path. The lower ends of the first n-type regions 22a are in contact with the n$^+$-type drain layer 11. The upper ends of the first p-type regions 22b are in contact with the well bottoms of the respective p-type base regions 13a. The lower ends of the first p-type regions 22b are in contact with the n$^+$-type drain layer 11.

The n-channel vertical MOSFET includes also a peripheral region 30 surrounding the drift region 22. The peripheral region 30 includes a second alternating conductivity type layer on the n$^+$-type drain layer 11 and a third alternating conductivity type layer on the second alternating conductivity type layer. The third alternating conductivity type layer is on the first major surface side of the semiconductor chip. The second alternating conductivity type layer includes second n-type regions 30a and second p-type regions 30b. The second n-type regions 30a and the second p-type regions 30b are shaped with respective layers extending vertically in the thickness direction of the semiconductor chip. The second n-type regions 30a and the second p-type regions 30b are laminated alternately along the major surface of the semiconductor chip at the repeating pitch P1, which is almost the same as the repeating pitch of the first alternating conductivity type layer. The impurity concentration in the second alternating conductivity type layer in the peripheral region 30 is almost the same as that in the first alternating conductivity type layer in the drift region 22.

The third alternating conductivity type layer includes third n-type regions 34a and third p-type regions 34b. The third n-type regions 34a and the third p-type regions 34b are shaped with respective layers extending vertically in the thickness direction of the semiconductor chip. The third n-type regions 34a and the third p-type regions 34b are laminated alternately along the major surface of the semiconductor chip at a repeating pitch P2. Although the impurity concentration in the third alternating conductivity type layer is substantially the same as that in the second alternating conductivity type layer, the pitch P2 of the third alternating conductivity type layer is narrower than the pitch P1 of the first and second alternating conductivity type layers.

In the planar arrangement, the regions in the first, second and third alternating conductivity type layers are shaped with respective stripes extending parallel to each other. A third p-type region 34ba and a third n-type region 34aa adjacent to and extending parallel to the first alternating conductivity type layer extend below the outermost p-type base region 13a. The third p-type regions 34bb and the third n-type regions 34ab, with the end faces thereof in contact with the end faces of the first n-type regions 22a and the first p-type regions 22b, respectively, also extend below the p-type base regions 13a.

An oxide film (insulation film) 33 is formed on the third alternating conductivity type layer such that the oxide film 33 becomes thicker from the drift region 22 toward the peripheral region 30 in a stepwise manner. A field plate FP is extended from the source electrode 17 onto the oxide film 33 such that the field plate FP covers part of the third alternating conductivity type layer. An n-type channel stopper region 50 is formed around the peripheral region 30. A stopper electrode 51 connected electrically to the n-type channel stopper region 50 is on the first major surface side of the n-type channel stopper region 50.

The vertical MOSFET according to the fifth embodiment can be of the 600 V class. The exemplary dimensions and the impurity concentrations of the constituent layers and regions of the fifth embodiment are substantially similar to those of the first embodiment. The drift region 22 is 44.0 μm thick. The first n-type regions 22a and the first p-type regions 22b are 8.0 μm wide, respectively. Therefore, the pitch P1 is 16.0 μm. The impurity concentration in the first alternating conductivity type layer is $2.4 \times 10^{15}$ cm$^{-3}$. The second alternating conductivity type layer in the peripheral region 30 is 31.0 μm in thickness. The second n-type regions 30a and the second p-type regions 30b are 8.0 μm wide, respectively. Therefore, the pitch P1 of the second alternating conductivity type layer is 16.0 μm. The impurity concentration in the second alternating conductivity type layer is $2.4 \times 10^{15}$ cm$^{-3}$. The third alternating conductivity type layer in peripheral region 30 is 13.0 μm thick. The third n-type regions 34a and the third p-type regions 34b are 4.0 μm wide, respectively. Therefore, the pitch P2 of the third alternating conductivity type layer is 8.0 μm. The impurity concentration in the third alternating conductivity type layer is $2.4 \times 10^{15}$ cm$^{-3}$. The diffusion depth of the p-type base regions 13a is 3.0 μm. The surface impurity concentration of the p-type base regions 13a is $3.0 \times 10^{17}$ cm$^{-3}$. The diffusion depth of the n$^+$-type source region 14 is 1.0 μm. The surface impurity concentration of the n$^+$-type source region 14 is $3.0 \times 10^{20}$ cm$^{-3}$. The diffusion depth of the sandwiched region 12e, which works as a surface drift region, is 2.5 μm. The surface impurity concentration of the sandwiched region 12e is $2.0 \times 10^{16}$ cm$^{-3}$. The n$^+$-type drain layer 11 is 300 μm thick. The impurity concentration in the n$^+$-type drain layer 11 is $2.0 \times 10^{18}$ cm$^{-3}$. The n-type channel stopper region 50 is 30.0 μm wide. The impurity concentration in the n-type channel stopper region 50 is $6.0 \times 10^{15}$ cm$^{-3}$.

When the peripheral region 30 is formed only of the third alternating conductivity type layer, a charge imbalance will be formed inevitably across the boundary between the first p-type region 22b and the third n-type region 34a, further drastically lowering the breakdown voltage, since the width of the n-type regions and the p-type regions in the third alternating conductivity type layer is narrower than the width of the n-type regions and the p-type regions in the first alternating conductivity type layer. When the charge balance is maintained, the electric field distribution is almost flat across the thickness direction (depth direction) of the alternating conductivity type layers. When the charge imbalance is present, the electric field is distributed along a gradient in the thickness direction (depth direction) of the alternating conductivity type layers. When the third alternating conductivity type layer is thicker, the lowering of the breakdown voltage is larger since a larger charge imbalance is formed. However, the impurity concentrations in the first and second alternating conductivity type layers are almost the same in the vertical MOSFET according to the fifth embodiment. Moreover, the junction depth between the first p-type regions 22b of the first alternating conductivity type layer and the second n-type regions 30a of the second alternating conductivity type layer in contact with the respective first p-type regions 22b is long. Moreover, the third alternating conductivity type layer on the first major surface side is thin. Since a charge imbalance is formed only across the boundary between the first and third alternating conductivity type layers, the imbalance charge amount is small and the lowering of the breakdown voltage is suppressed to a minimum. Moreover, the vertical MOSFET according to the fifth embodiment facilitates to secure the designed breakdown voltage since the surface electric field is relaxed and since the depletion layers expand easily in the surface portion of the third alternating conductivity type layer due to the pitch P2 of the third alternating conductivity type layer being set narrower than the pitch P1 of the first alternating conductivity type layer. Since the thick insulation film 33 shares the breakdown voltage, a higher breakdown voltage is obtained. According to the fifth embodiment, the impurity concentration in the third alternating conductivity type layer may be set, for example, at $1.2 \times 10^{15}$ cm$^{-3}$, which is lower than the impurity concentration in the first and second alternating conductivity type layer. The low impurity concentration in the third alternating conductivity type layer facilitates to expand the depletion layers in the surface portion of the peripheral region 30.

In the Y-direction, the n-type regions 34ab and the p-type regions 34bb are between the n-type channel stopper region 50 and p-type base region 13a. Since the n-type regions 34ab and the p-type regions 34bb are reverse biased in the off-state of the device, almost no breakdown voltage is lowered.

According to the fifth embodiment, a p-type region 34ba and an n-type region 34aa of the third alternating conductivity type layer extend below the peripheral portion of the p-type base region 13a. Due to this configuration, the electric field localization below the peripheral portion of the p-type base region 13a is relaxed. Since the field plate FP covers the third alternating conductivity type layer with the thick insulation film 33 interposed therebetween, the depletion layers in the surface portion of the third alternating conductivity type layer are controllable and a higher breakdown voltage is obtained. The n-type channel stopper region 50 and the stopper electrode 51 facilitate to control the leakage current.

Figure 16:
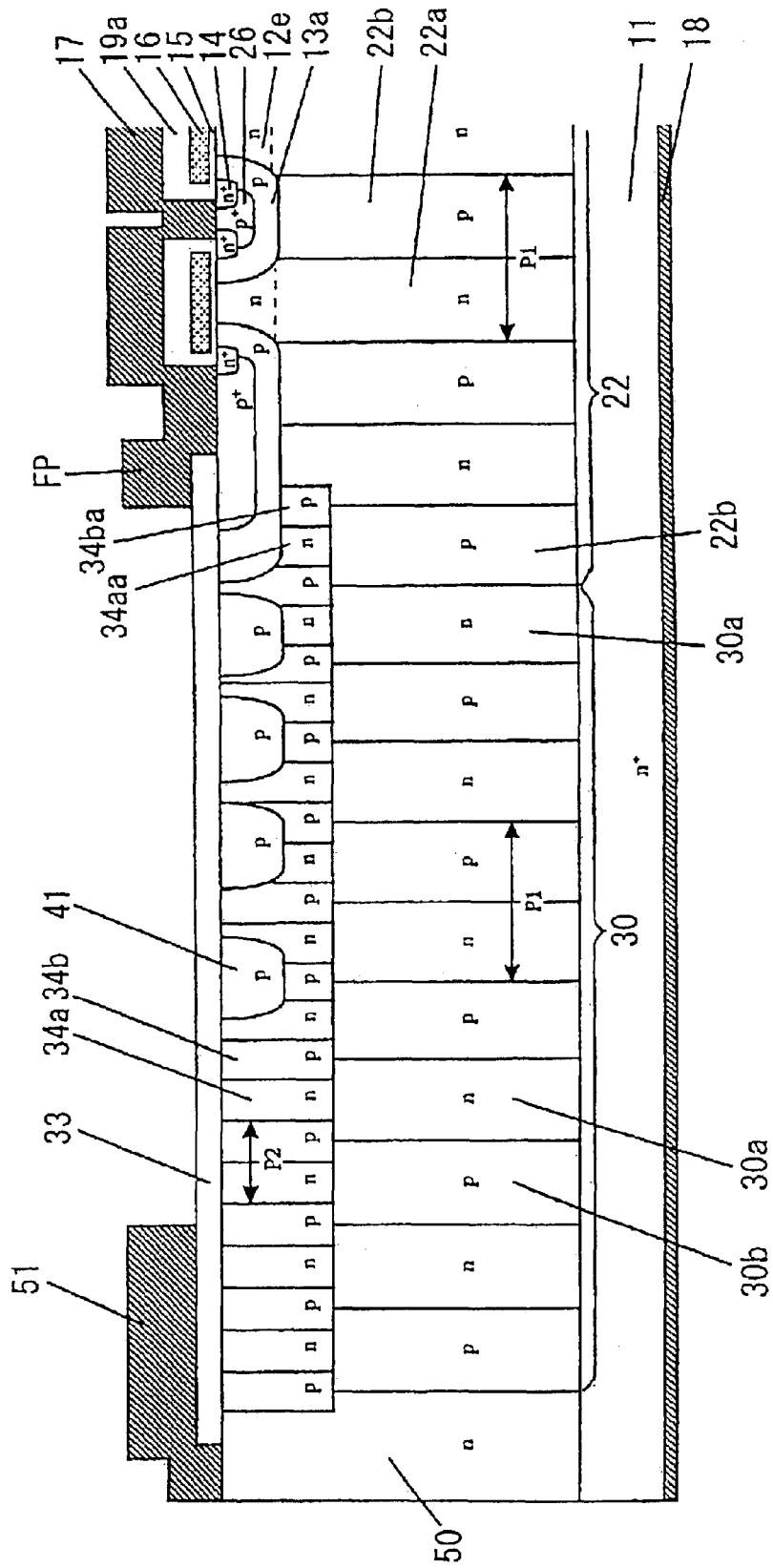
FIG. 16 is a cross sectional view showing of a vertical MOSFET according to the sixth embodiment of the invention.

FIG. 16 is a cross sectional view showing of a vertical MOSFET according to a sixth embodiment of the invention. The vertical MOSFET according to the sixth embodiment is a first modification of the vertical MOSFET according to the fifth embodiment. As the comparison of FIGS. 16 and 14 clearly indicates, p-type guard rings 41 are formed in the surface portion of the third alternating conductivity type layer according to the sixth embodiment. Since the p-type guard rings 41 share the surface breakdown voltage, the surface electric field is relaxed and a higher breakdown voltage is obtained.

Figure 17:
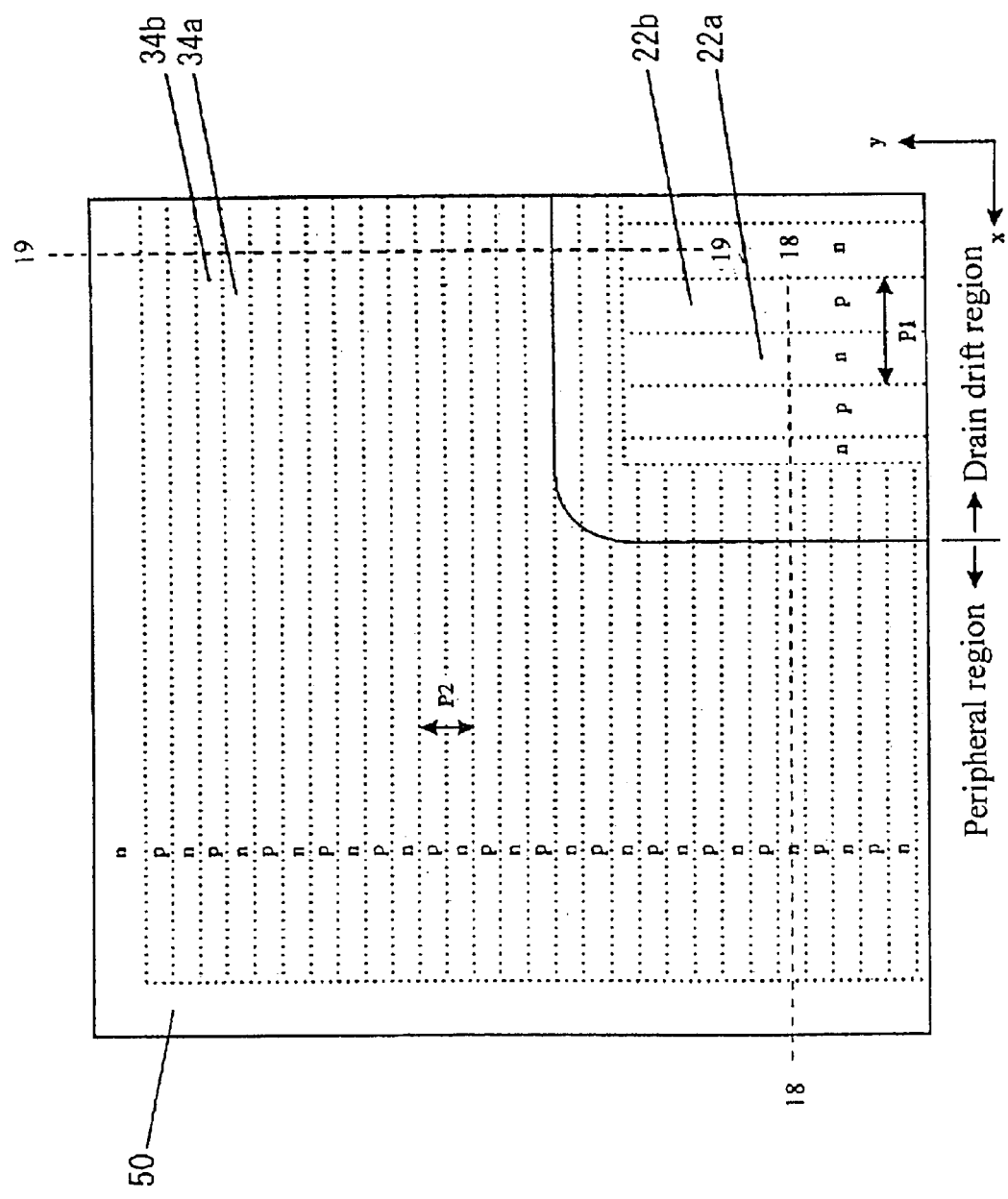
FIG. 17 is a top plan view showing a quarter of the drift region (active region) of a vertical MOSFET according to the seventh embodiment of the invention.
Figure 18:
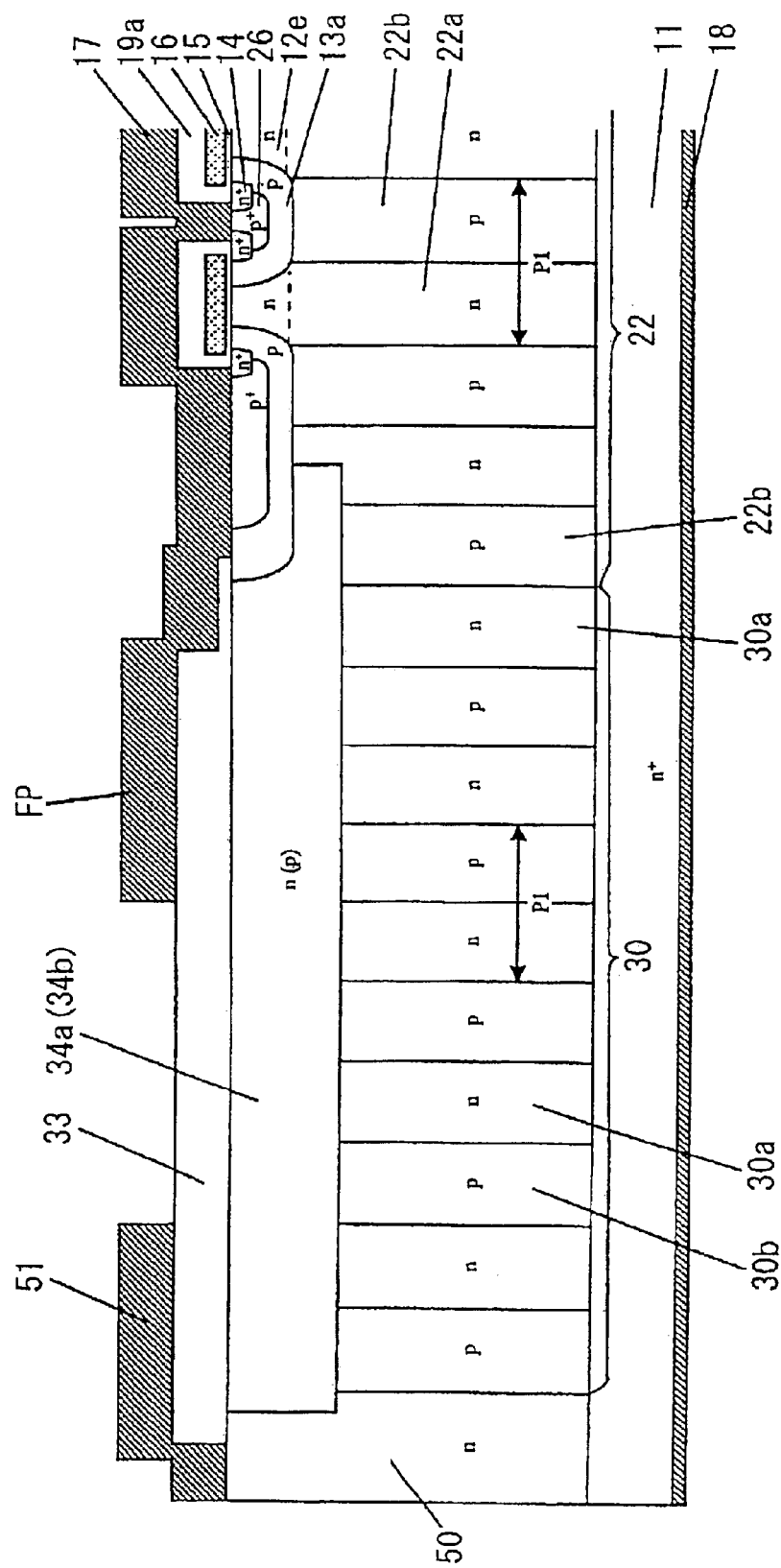
FIG. 18 is a cross section taken along line 18—18 of FIG. 17.
Figure 19:
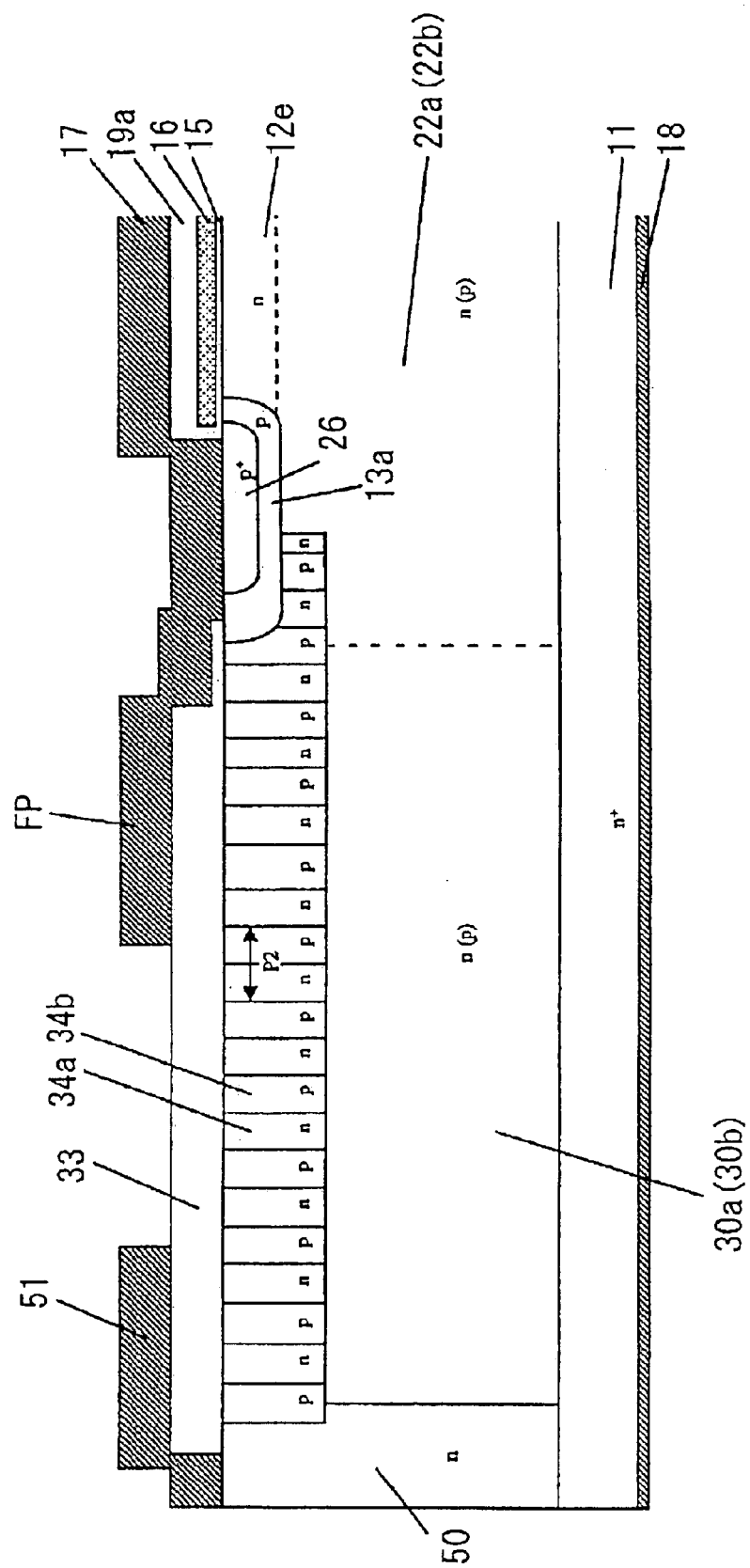
FIG. 19 is a cross section taken along line 19—19 of FIG. 17.

FIG. 17 is a top plan view showing a quarter of the drift region (active region) of a vertical MOSFET according to a seventh embodiment of the invention. FIG. 18 is a cross section taken along line 18—18 of FIG. 17. FIG. 19 is a cross section taken along line 19—19 of FIG. 17. The vertical MOSFET according to the seventh embodiment is a second modification of the vertical MOSFET according to the fifth embodiment. The vertical MOSFET according to the seventh embodiment is different from the vertical MOSFET according to the fifth embodiment in that the third n-type regions 34a and the third p-type regions 34b in the peripheral region 30 extend in the planar arrangement perpendicular to the first n-type regions 22a and the first p-type regions in the drift region 22 according to the seventh embodiment. In other words, the direction, in which the third n-type regions 34a and the third p-type regions 34b are alternately arranged is substantially perpendicular to the direction in which the first n-type regions 22a and the first p-type regions 22b are alternately arranged in the vertical MOSFET according to the seventh embodiment. As long as the third alternating conductivity type layer has a narrower pitch P2 than the pitch P1 of the first alternating conductivity type layer and is much thinner than the first alternating conductivity type layer, the third n-type regions 34a and third p-type regions 34b in the peripheral region 30 can extend perpendicular to the first n-type regions 22a and the first p-type regions 22b in the drift region 22 with no problem.

The configuration according to the seventh embodiment facilitates to prevent the formation of charge imbalance across the boundary between the first alternating conductivity type layer and the peripheral region 30 and to expand the depletion layers in the surface portion of the peripheral region 30 in the same manner as the configuration according to the fifth embodiment. The configuration according to the seventh embodiment is advantageous in that it increases the design freedom.

Figure 20:
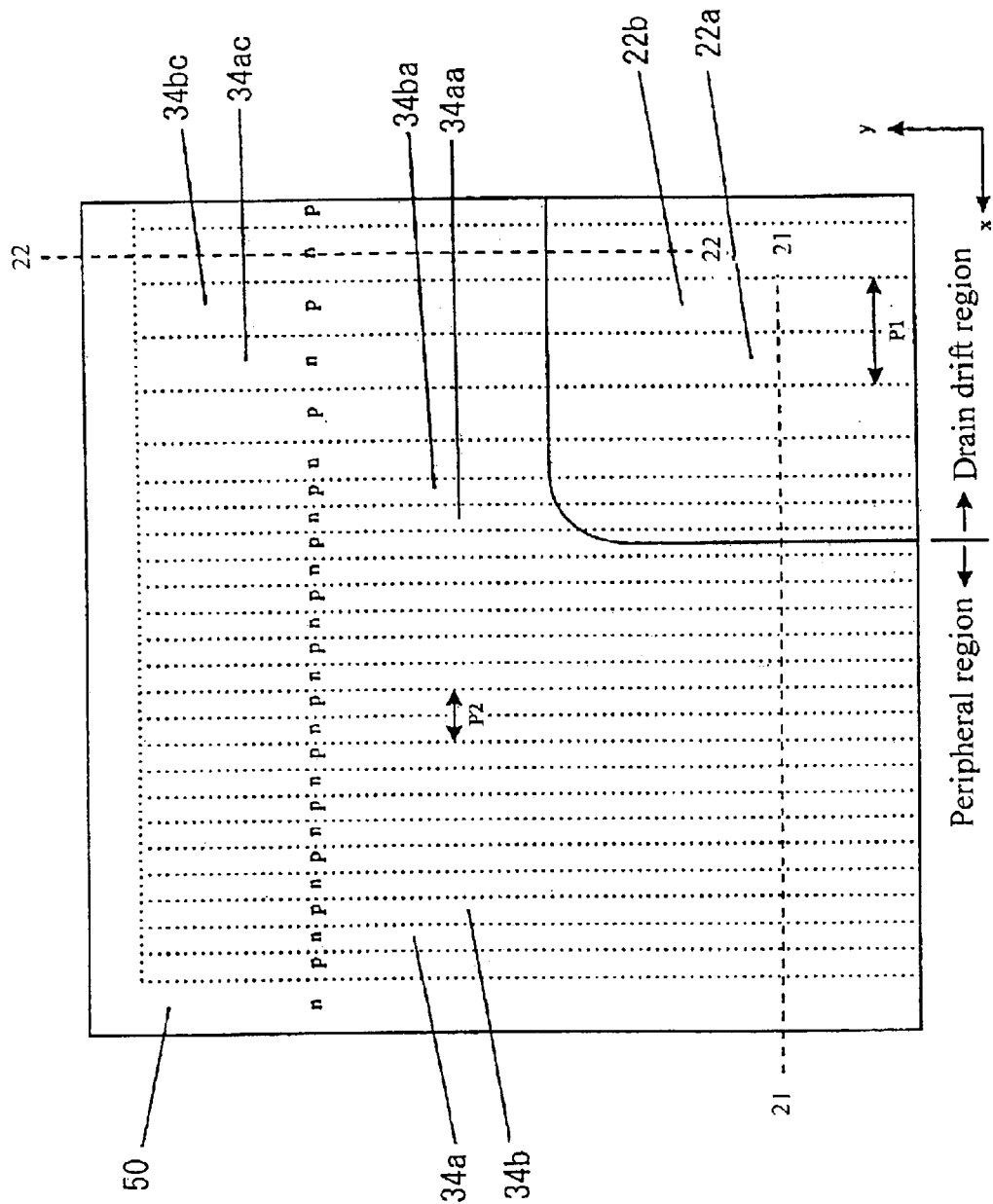
FIG. 20 is a top plan view showing a quarter of the drift region (active region) of a vertical MOSFET according to the eighth embodiment of the invention.
Figure 21:
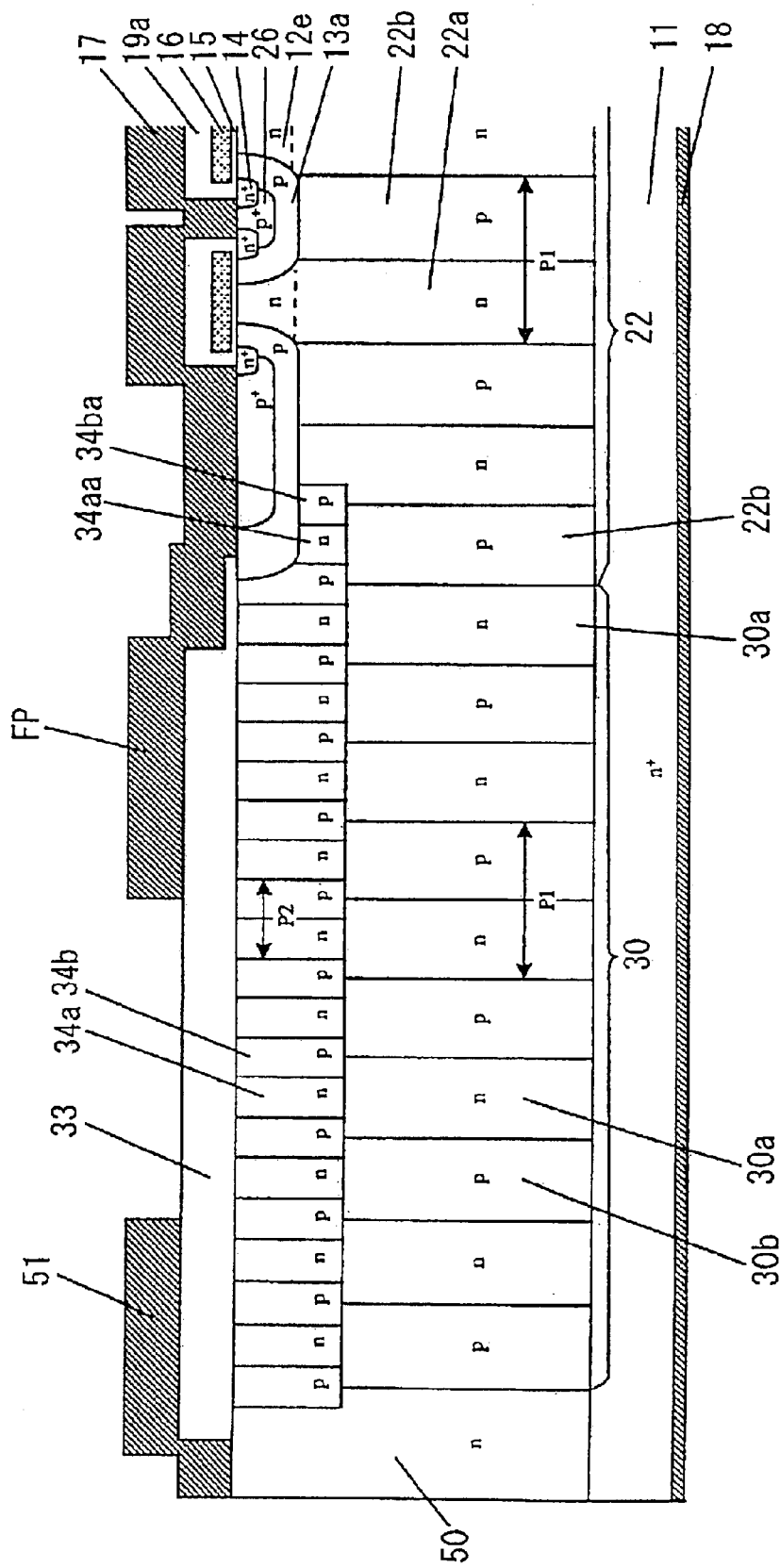
FIG. 21 is a cross section taken along line 21—21 of FIG. 20.
Figure 22:
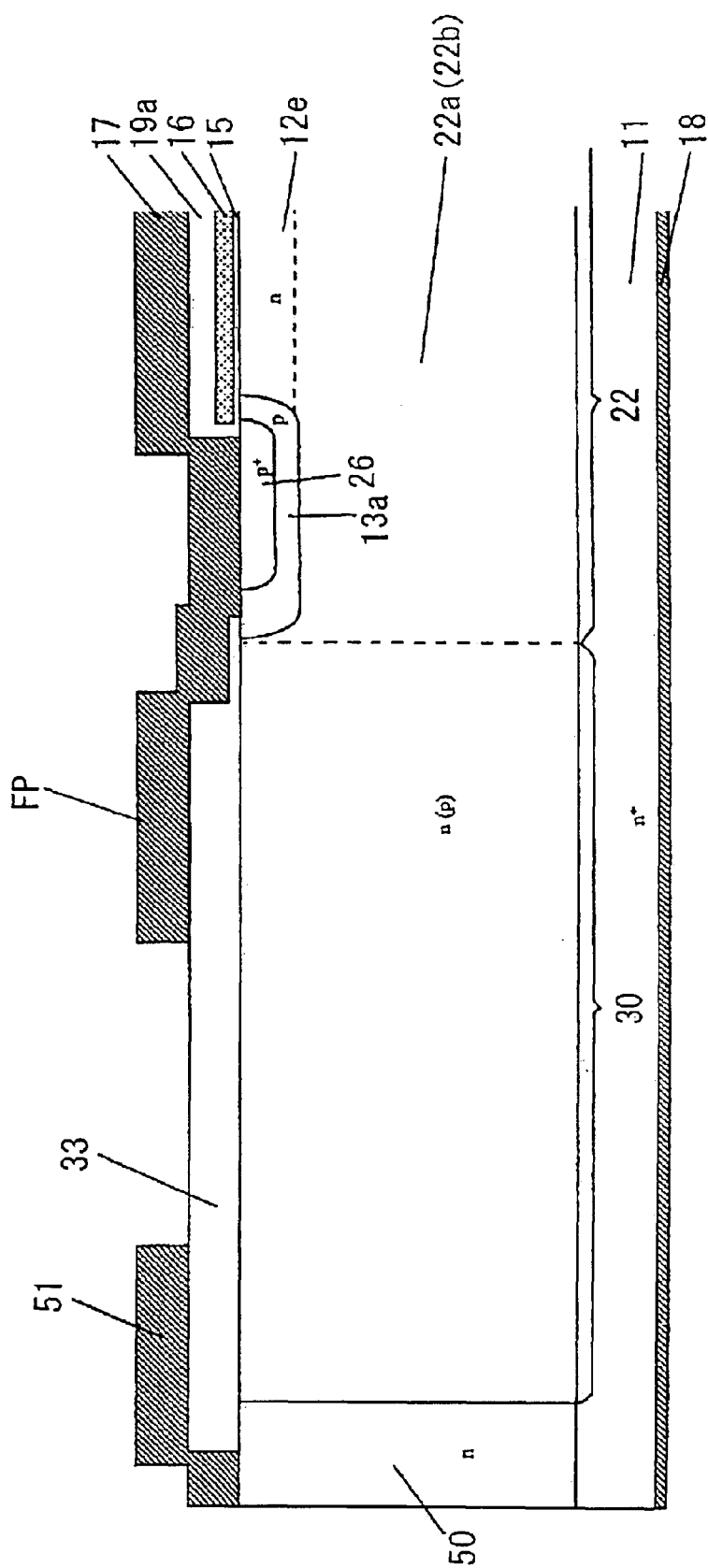
FIG. 22 is a cross section taken along line 22—22 of FIG. 20.

FIG. 20 is a top plan view showing a quarter the drift region (active region) of a vertical MOSFET according to an eighth embodiment of the invention. FIG. 21 is a cross section taken along line 21—21 of FIG. 20. FIG. 22 is a cross section taken along line 22—22 of FIG. 20. The vertical MOSFET according to the eighth embodiment is a third modification of the vertical MOSFET according to the fifth embodiment. The vertical MOSFET according to the eighth embodiment is different from the vertical MOSFET according to the fifth embodiment in that the width of the n-type regions 34*ac* and the p-type regions 34*bc*, with the end faces thereof in contact with the end faces of the first n-type regions 22*a* and the first p-type regions 22*b*, is the same as the width of the first n-type regions 22*a* and the first p-type regions 22*b*. In the Y-direction, the n-type region 34*ac* and the p-type region 34*bc* are between the n-type channel stopper region 50 biased at the drain potential and the p-type base regions 13*a* biased at the source potential. Therefore, even if the second pitch P2 is not narrow, the n-type regions 34*ac* and the p-type regions 34*bc* will sustain the breakdown voltage, since depletion layers expand surely into the n-type regions 34*ac* and the p-type regions 34*bc*. Thus, it is not necessary to completely surround the p-type base regions 13*a* as an active region of the device by the surface portion of the peripheral region 30.

Figure 23:
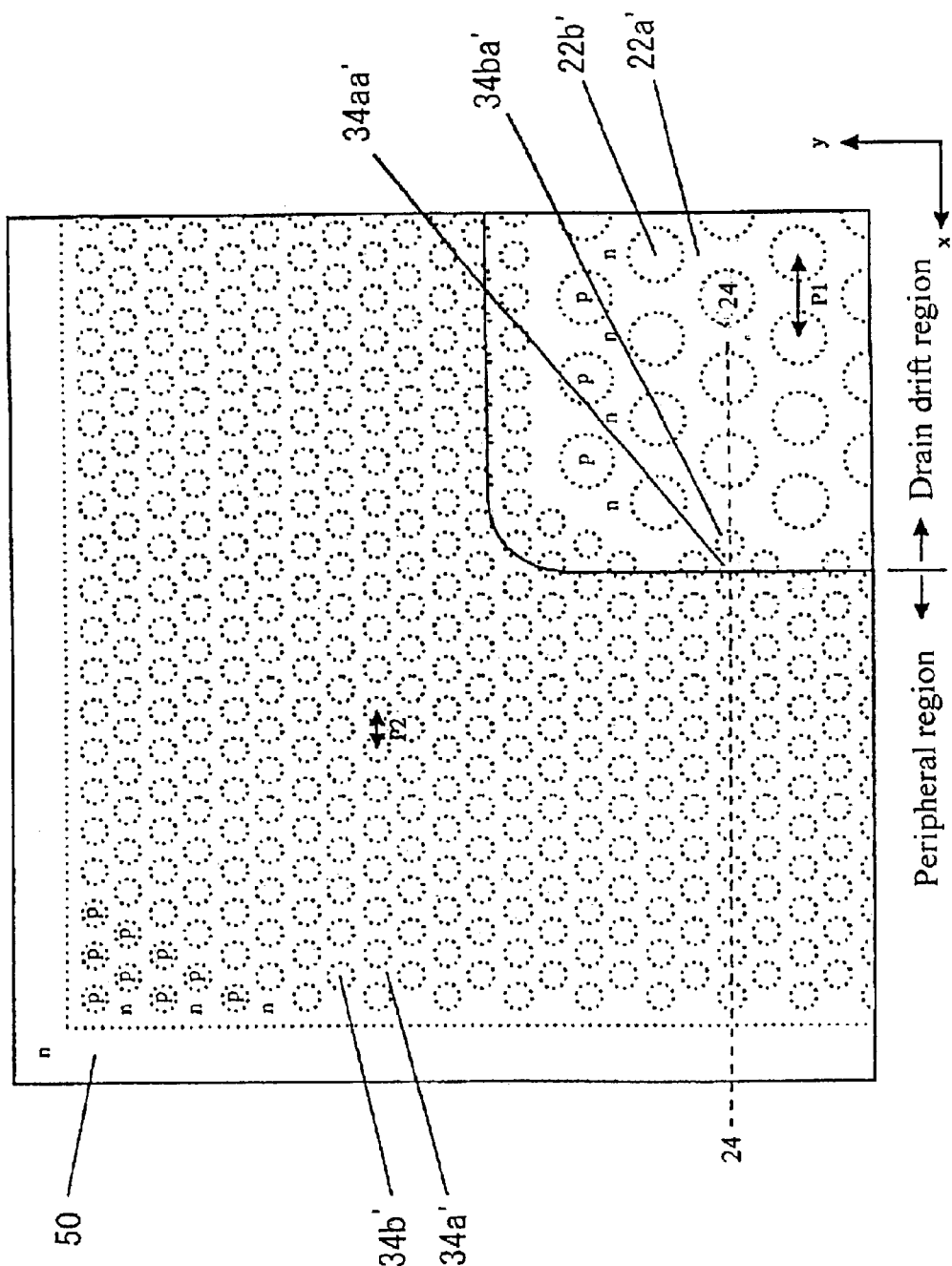
FIG. 23 is a top plan view showing a quarter of the drift region (active region) of a vertical MOSFET according to the ninth embodiment of the invention.
Figure 24:
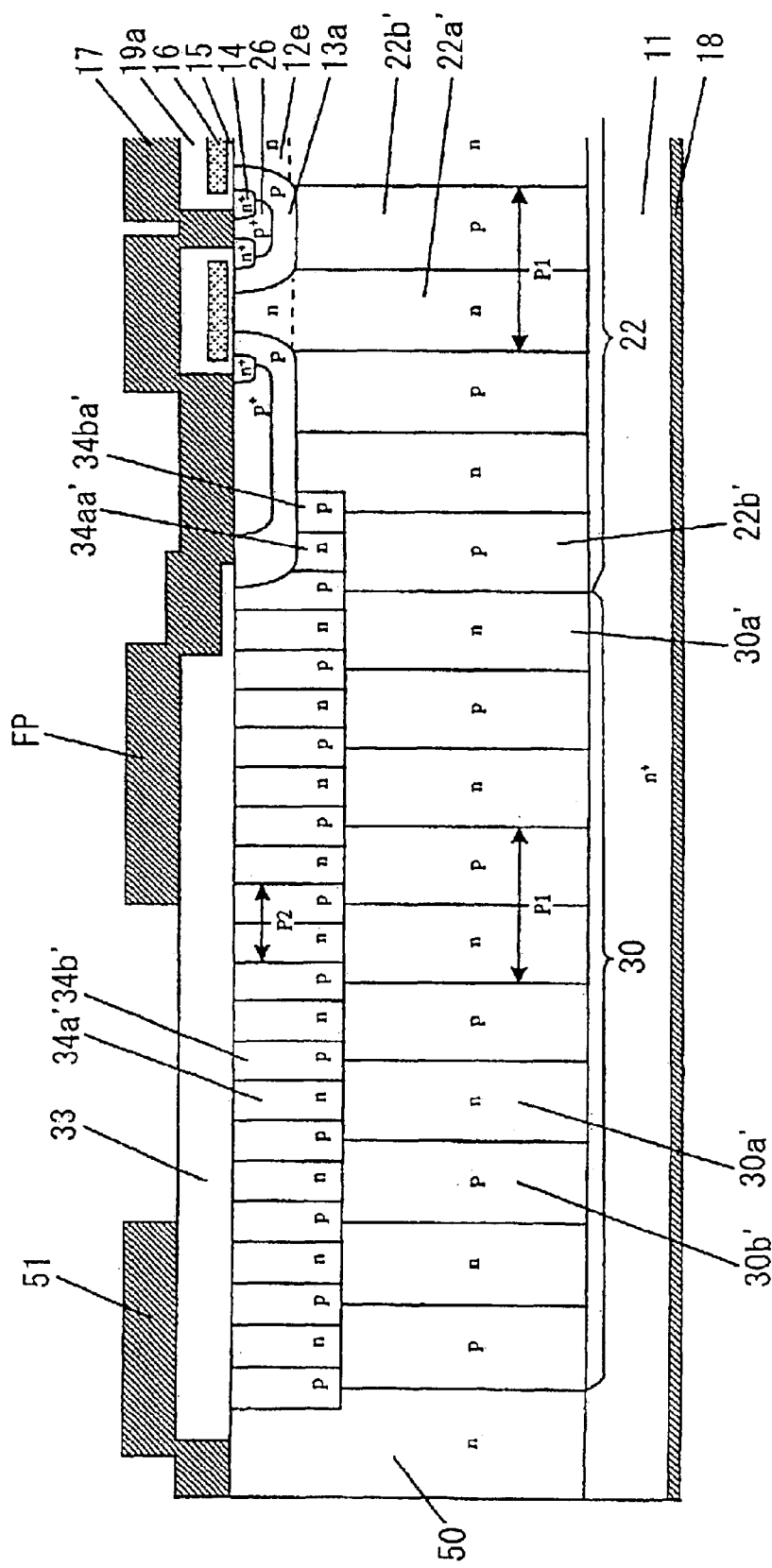
FIG. 24 is a cross section taken along line 24—24 of FIG. 23.

FIG. 23 is a top plan view showing a quarter of the drift region (active region) of a vertical MOSFET according to a ninth embodiment of the invention. FIG. 24 is a cross section taken along line 24—24 of FIG. 23. The vertical MOSFET according to the ninth embodiment is a fourth modification of the vertical MOSFET according to the fifth embodiment. In the vertical MOSFET according to the ninth embodiment, the p-type regions 22*b*', 30*b*' and 34*b*' in the first through third alternating conductivity type layers are columns standing vertically at the lattice points of a planar hexagonal lattice. An n-type region 22*a* surrounds the p-type regions 22*b*', an n-type region 30*a* surrounds the p-type regions 30*b*', and an n-type region 34*a* surrounds the p-type regions 34*b*'. Alternatively, the n-type regions 22*b*', 30*a*' and 34*b*' can be columns standing vertically at the lattice points of a planar hexagonal lattice and surrounded by a p-type region 22*b*', a p-type region 30*b*', and a p-type region 34*b*', respectively. Still alternatively, the p-type regions 22*b*', 30*b*', and 34*b*' or n-type regions 22*b*', 30*a*', and 34*b*' can be positioned at the lattice points of a planar polygonal lattice such as a planar trigonal lattice and a planar tetragonal lattice. Further alternatively, any of the first through third alternating conductivity type layers can have a columnar arrangement of the n-type regions or the p-type regions thereof arid the other alternating conductivity type layers can have planar stripe arrangements. In the vertical MOSFET according to the ninth embodiment, the portions 34*aa*' of the n-type region 34*a* and some p-type regions 34*ba*' are below the p-type base regions 13*a*.

Figure 25:
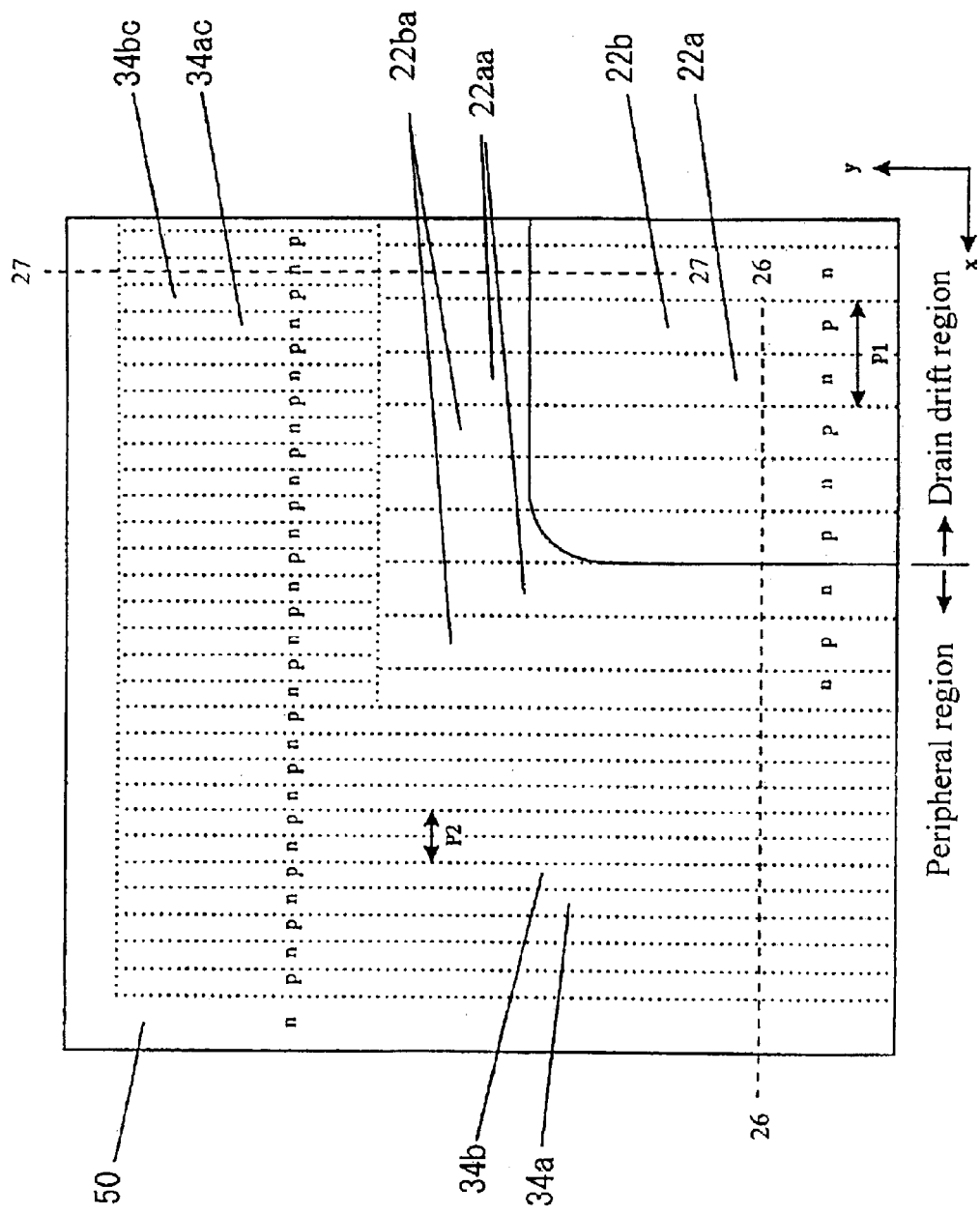
FIG. 25 is a top plan view showing a quarter of the drift region (active region) of a vertical MOSFET according to the tenth embodiment of the invention.
Figure 26:
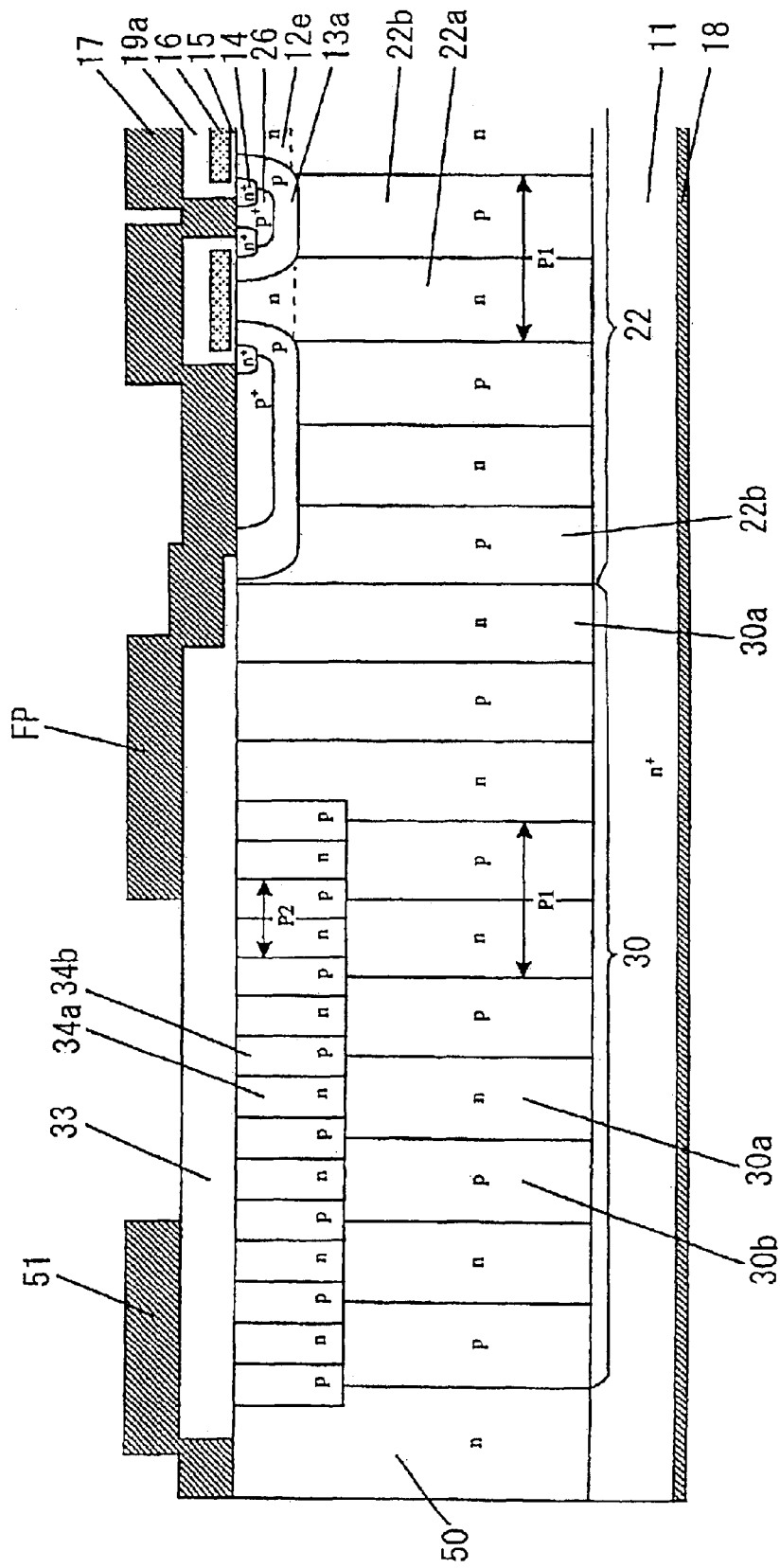
FIG. 26 is a cross section taken along line 26—26 of FIG. 25.
Figure 27:
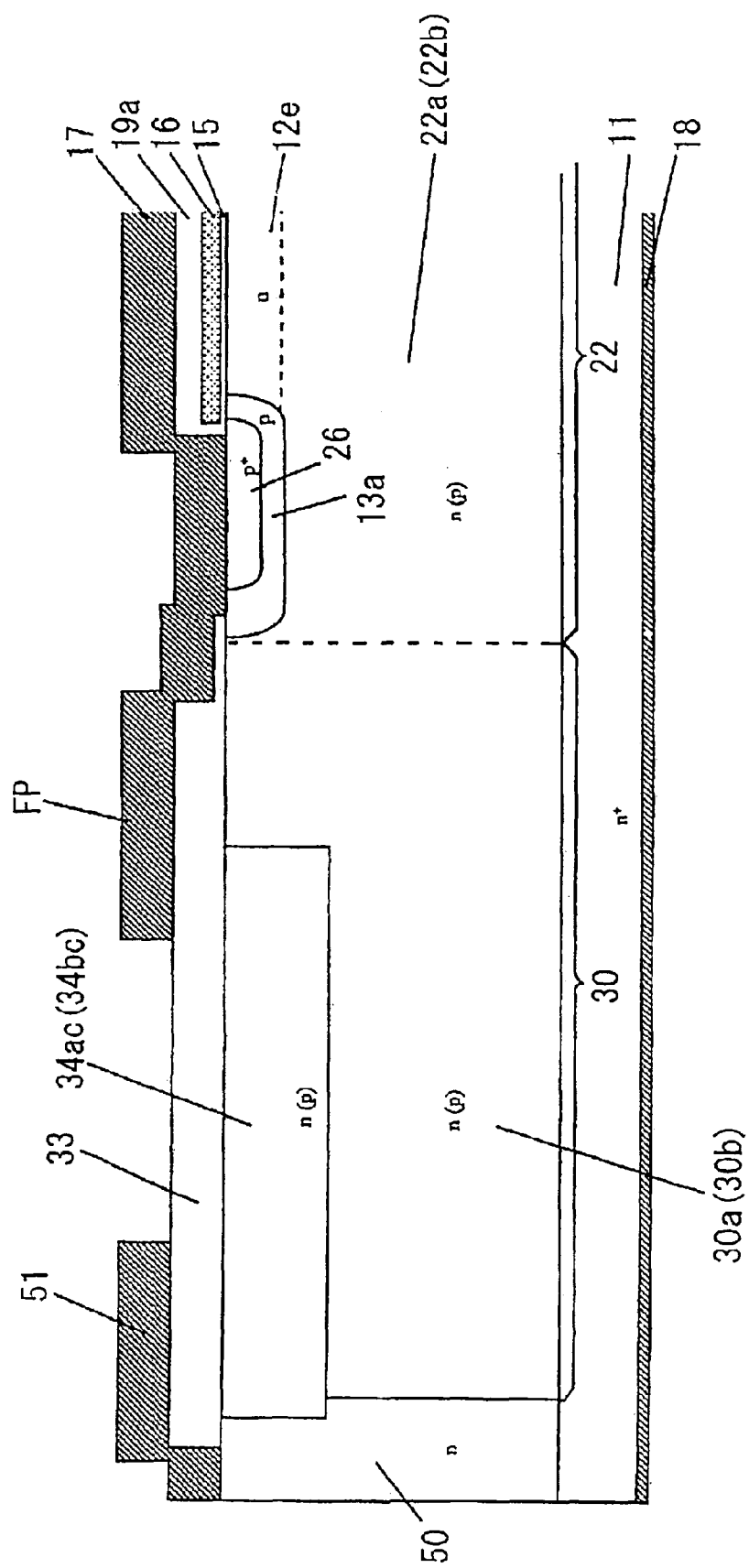
FIG. 27 is a cross section taken along line 27—27 of FIG. 25.

FIG. 25 is a top plan view showing a quarter of the drift region (active region) of a vertical MOSFET according to a tenth embodiment of the invention. FIG. 26 is a cross section taken along line 26—26 of FIG. 25. FIG. 27 is a cross section taken along line 27—27 of FIG. 25. The vertical MOSFET according to the tenth embodiment is a fifth modification of the vertical MOSFET according to the fifth embodiment. The vertical MOSFET according to the tenth embodiment is different from the vertical MOSFET according to the fifth embodiment in that the first alternating conductivity type layer in the drift region 22 extends outward from the p-type base regions 13*a*, the third alternating conductivity type layer in the surface portion of peripheral region 30 is not in contact with any of p-type regions 13*a*, and a field plate FP covering the extended portion of the first alternating conductivity type layer, including the first n-type regions 22*aa*, the first p-type regions 22*ba*, and part of the third alternating conductivity type layer is formed on the thick oxide film 33.

When a field plate extends above the third alternating conductivity type layer over the boundary between the first alternating conductivity type layer in the drift region 22 and the third alternating conductivity type layer, across which the pitch changes, the voltage at which the third alternating conductivity type layer, the pitch thereof being narrower, should sustain can be reduced by the voltage at which the field plate sustains. In other words, even when the charge imbalance is present across the boundary of the pitches, a breakdown voltage equivalent to the breakdown voltage in the state of charge balance will be obtained as long as the breakdown voltage lowering caused by the charge imbalance is smaller than the voltage sustained by the field plate FP. Moreover, the lowering of the breakdown voltage due to the charge imbalance is reduced, since the third alternating conductivity type layer is thinner than the first alternating conductivity type layer. Therefore, the configuration according to the tenth embodiment facilitates to reduce the lowering of the breakdown voltage even when the charge imbalance is present.

The direction, in which the third n-type regions and the third p-type regions in the third alternating conductivity type layer are arranged alternately at a narrower pitch, can be parallel to or perpendicular to the direction, in which the first n-type regions and the first p-type regions in the first alternating conductivity type layer are arranged alternately. Alternatively, the third n-type regions 34*a* or the third p-type regions 34*b* can be positioned at the lattice points of a planar polygonal lattice. The field plate FP extends directly from the source electrode 17 according to the tenth embodiment. Alternatively, the field plate FP and the source electrode 17 can be formed separately with an interlayer insulation film interposed therebetween.

Figure 28:
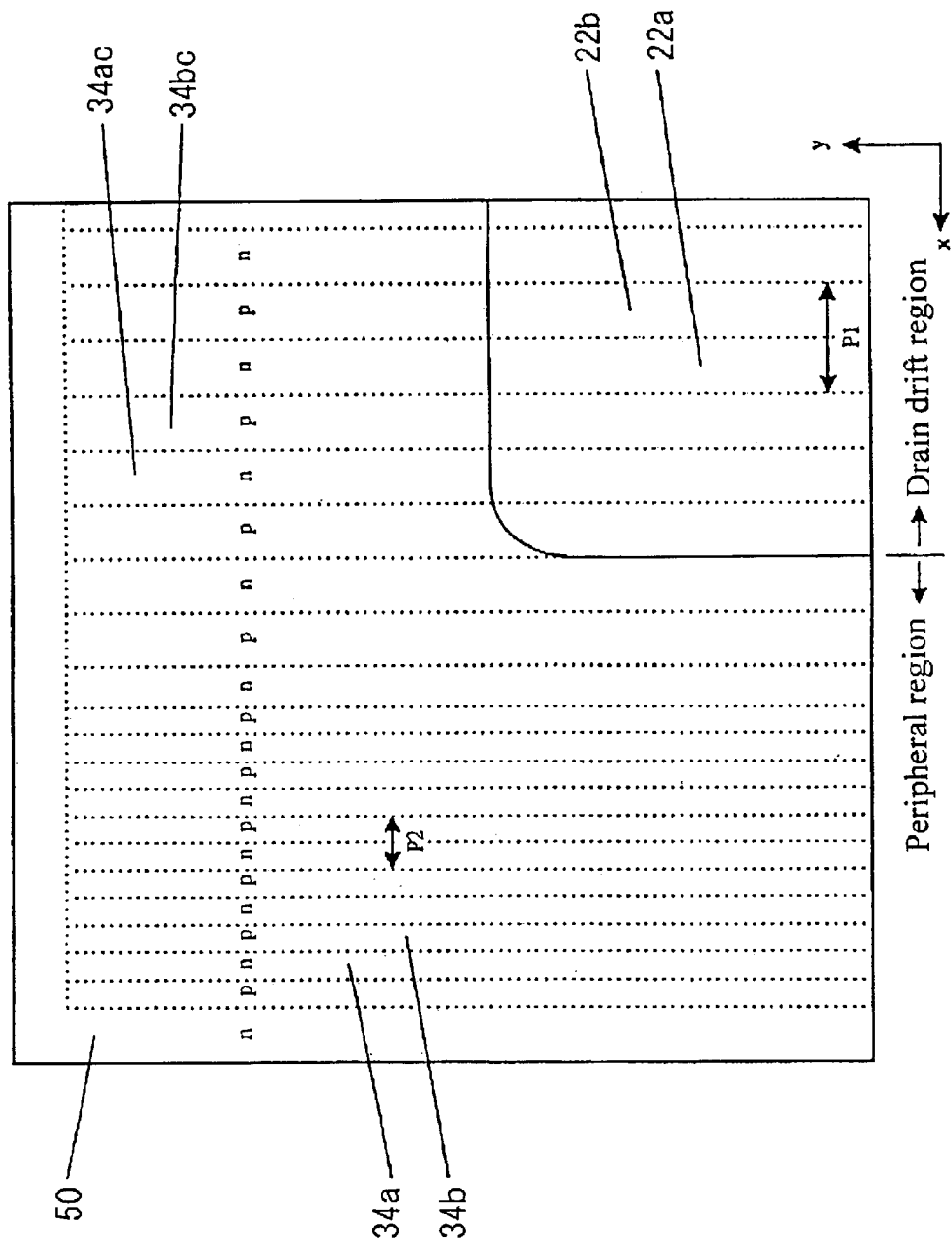
FIG. 28 is a top plan view of a vertical MOSFET according to the eleventh embodiment of the invention.

FIG. 28 is a top plan view of a vertical MOSFET according to an eleventh embodiment of the invention. The vertical MOSFET according to die eleventh embodiment is a modification of the vertical MOSFET according to the tenth embodiment. The vertical MOSFET according to the eleventh embodiment is different from the vertical MOSFET according to the tenth embodiment in that the n-type regions 34*ac*' and the p-type regions 34*bc*' of the third alternating conductivity type layer extend parallel to the n-type regions 22*a* and the p-type regions 22*b* of the first alternating conductivity type layer in the Y-direction, and the pitch P1 of the n-type regions 34*ac* and the p-type regions 34*bc* is the same as the pitch of the first alternating conductivity type layer. Since the n-type regions 34*ac* and the p-type regions 34*bc* are between an n-type channel stopper region 50 biased at the drain potential and a field plate FP biased at the source potential, the depletion layers expand into the n-type regions 34*ac* and the p-type regions 34*bc* without fail, even when the pitch thereof is not narrow. Therefore, the n-type regions 34*ac* and the p-type regions 34*bc* facilitate to sustain the breakdown voltage.

Since the n-type regions 34*ac* and the p-type regions 34*bc* are between an n-type channel stopper region 50 biased at the drain potential and a field plate FP biased at the source potential, the depletion layers expand into the n-type regions 34*ac* and the p-type regions 34*bc* without fail, even when the pitch thereof is not narrow. Therefore, the n-type regions 34*ac* and the p-type regions 34*bc* facilitate to sustain the breakdown voltage.

Figure 29:
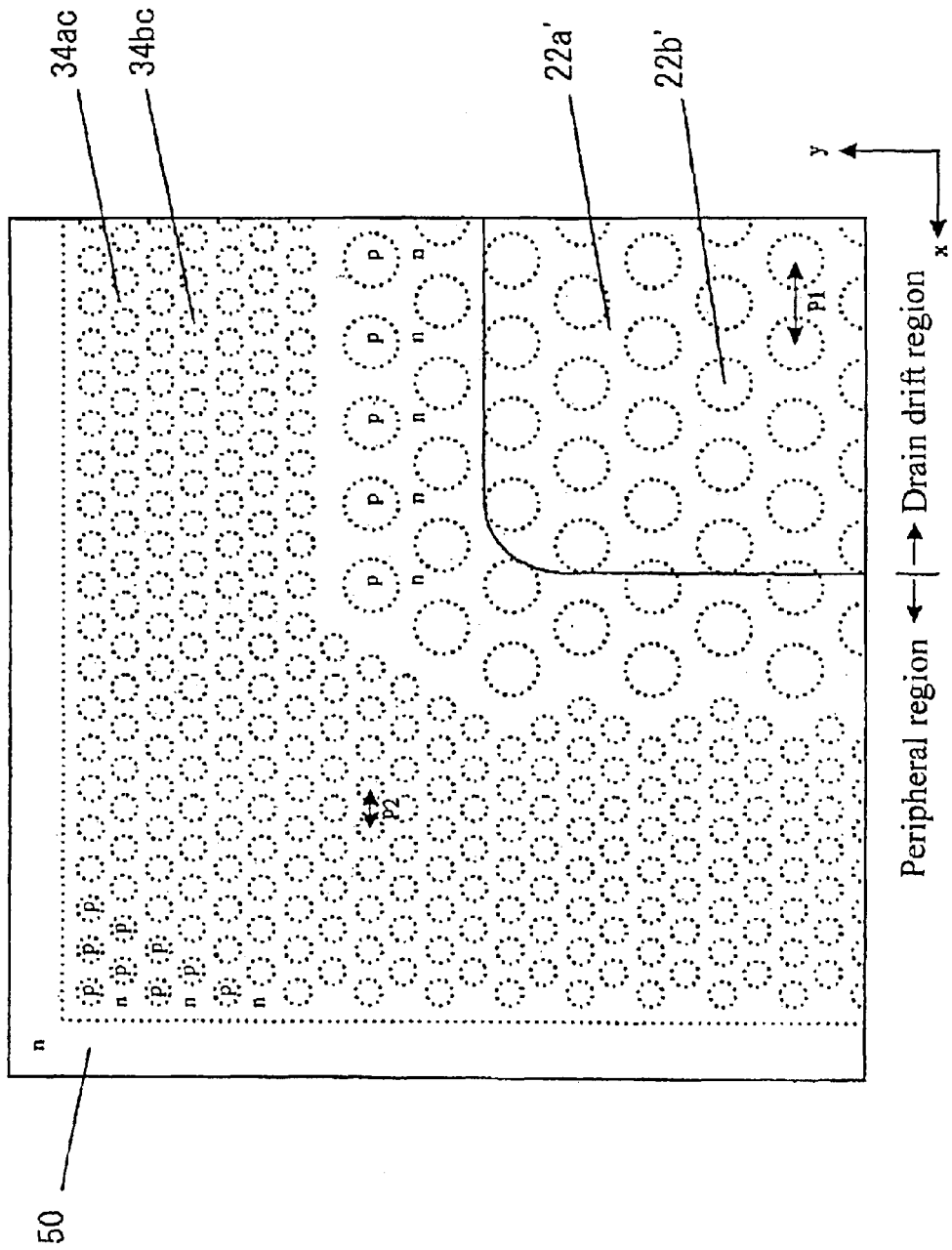
FIG. 29 is a top plan view of a vertical MOSFET according to the twelfth embodiment of the invention.
Figure 30:
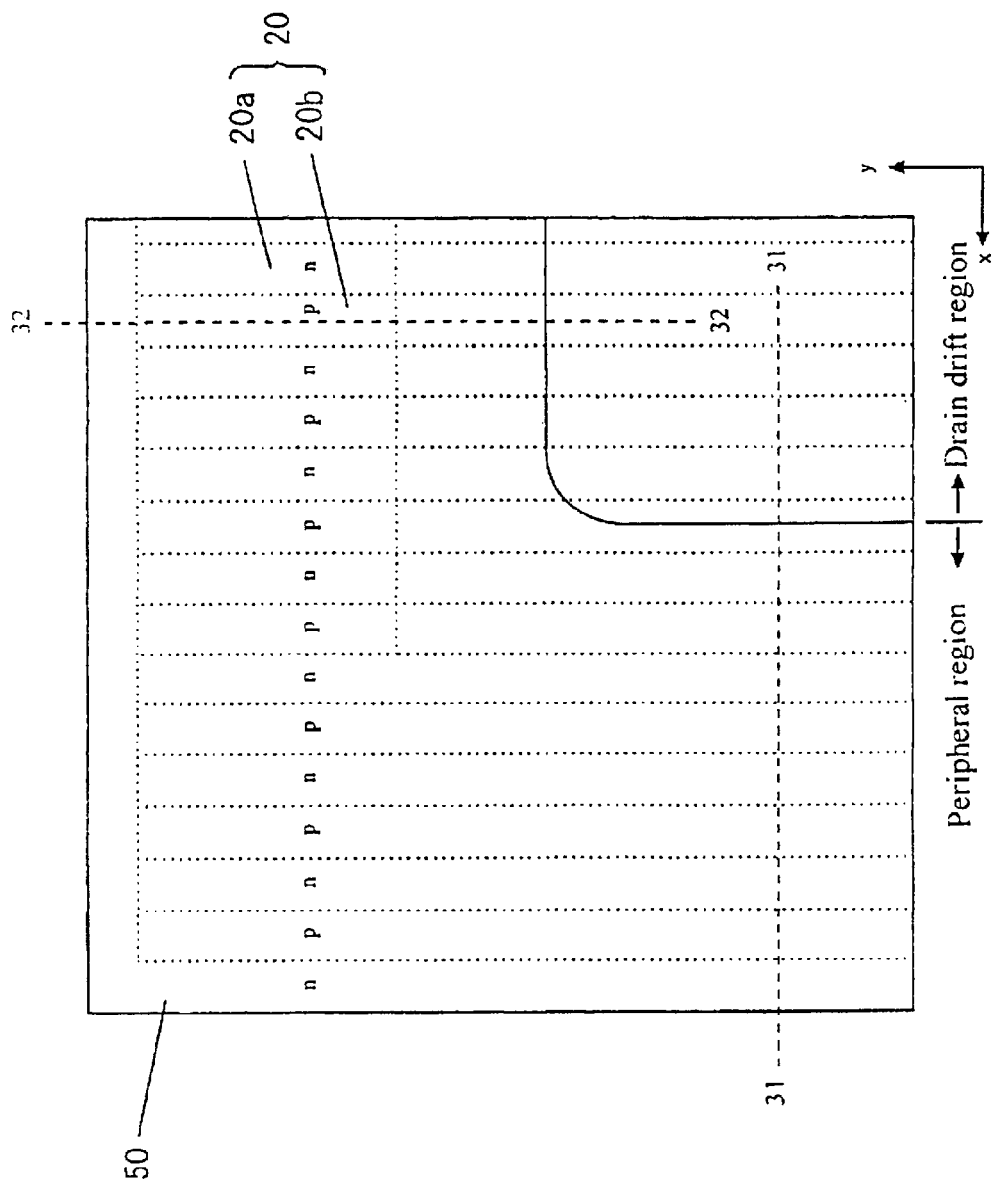
FIG. 30 is a top plan view of a quarter of the drift region and the peripheral region (breakdown withstanding region) of a conventional vertical MOSFET.
Figure 31:
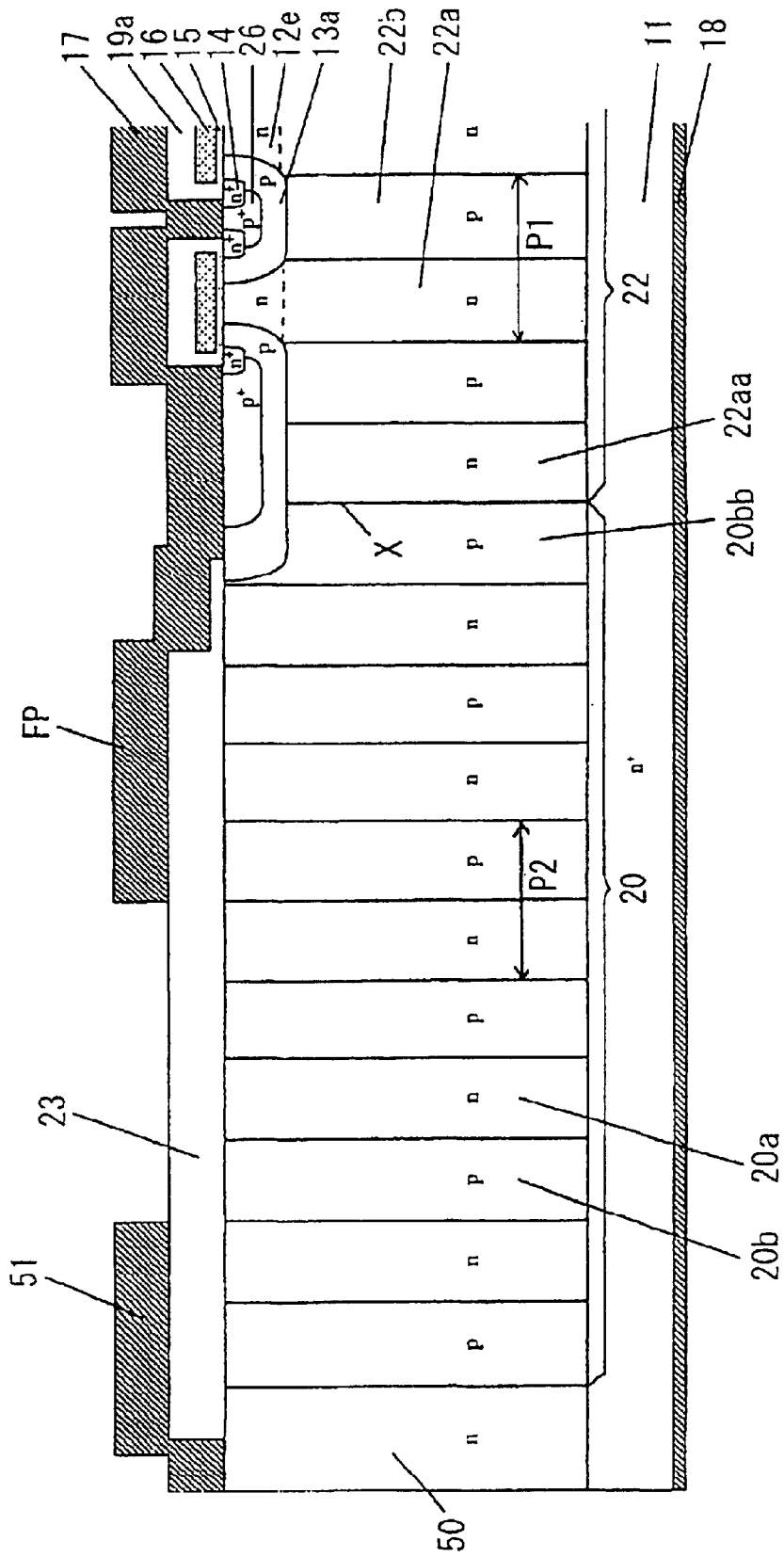
FIG. 31 is a vertical cross section taken along line 31—31 of FIG. 30.
Figure 32:
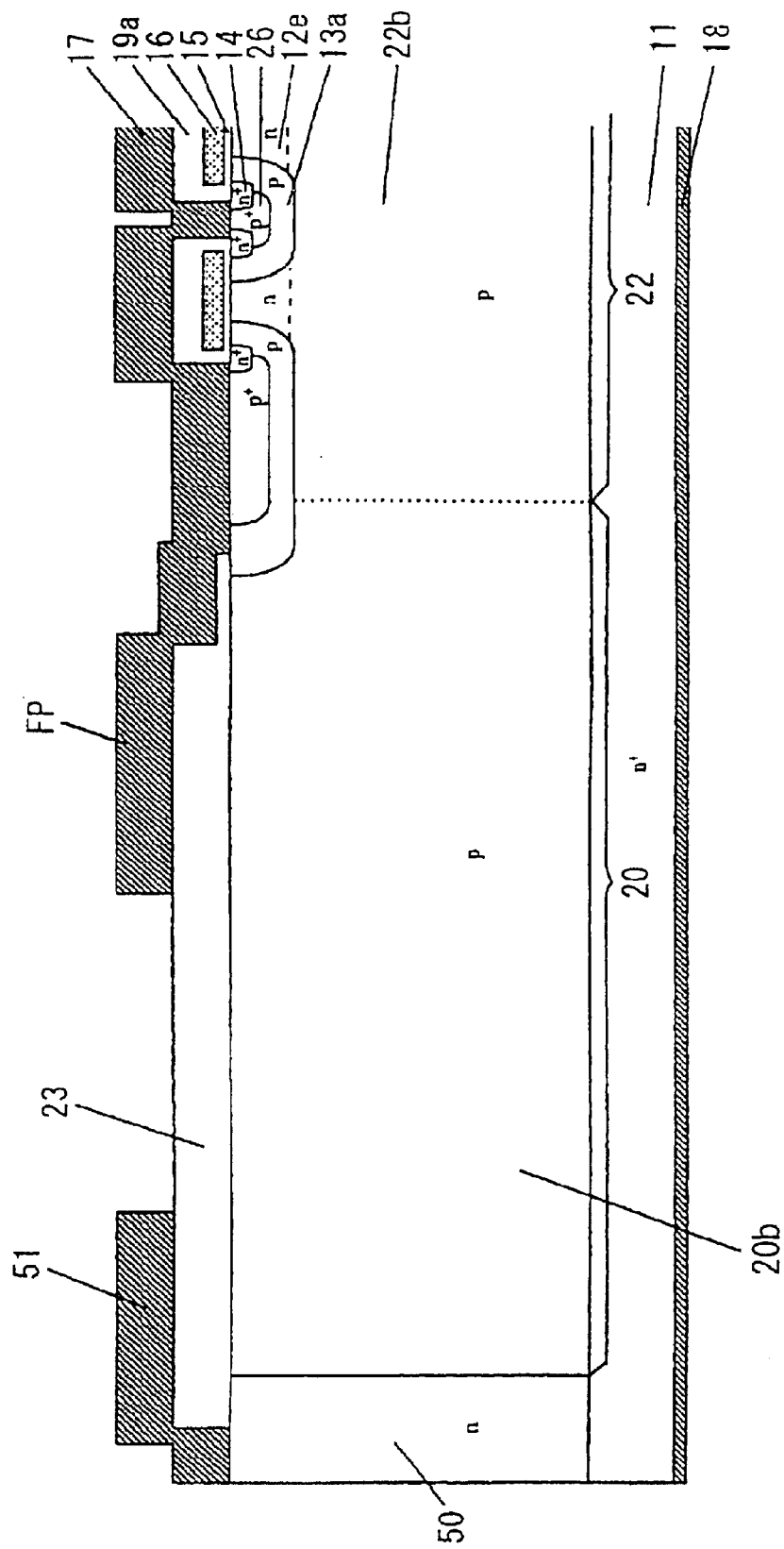
FIG. 32 is a vertical cross section taken along line 32—32 of FIG. 30.

FIG. 29 is a top plan view of a vertical MOSFET according to a twelfth embodiment of the invention. The vertical MOSFET according to the twelfth embodiment is also a modification of the vertical MOSFET according to the tenth embodiment. The vertical MOSFET according to the twelfth embodiment is different from the vertical MOSFET according to the tenth embodiment in that the vertical MOSFET according to the twelfth embodiment includes a first alternating conductivity type layer, including columnar p-type regions 22b' standing on the lattice points of a first planar hexagonal lattice and an n-type region 22a' surrounding the columnar p-type regions 22b', a second alternating conductivity type layer, including columnar p-type regions standing on the lattice points of the first planar hexagonal lattice and an n-type region surrounding the columnar p-type regions, and a third alternating conductivity type layer, including columnar p-type regions 34bc standing on the lattice points of a second planar hexagonal lattice and an n-type region 34ac surrounding the columnar p-type regions 34bc. Alternatively, the first alternating conductivity type layer includes columnar n-type regions 22a' standing on the lattice points of a first planar hexagonal lattice and a p-type region 22b' surrounding columnar n-type regions 22b', the second alternating conductivity type layer includes columnar n-type regions standing on the lattice points of the first planar hexagonal lattice and a p-type region 30a' surrounding the columnar n-type regions 30b', and the third alternating conductivity type layer includes columnar n-type regions 34b' standing on the lattice points of a second planar hexagonal lattice and a p-type region 34bc surrounding the columnar n-type regions 34ac. Still alternatively, the p-type regions 22b', 30b', and 34b' or the n-type regions 22b', 30b', and 34b' can be positioned at the lattice points of a planar polygonal lattice such as a planar trigonal lattice and a planar tetragonal lattice. Further alternatively, any of the first through third alternating conductivity type layers can have a columnar arrangement of the n-type regions or the p-type regions thereof and the other alternating conductivity type layers can have a planar stripe arrangement.

As described above, the vertical MOSFET according to the invention includes a drift region, including a first alternating conductivity type layer formed of first n-type regions and first p-type regions arranged alternately, and a peripheral region around the drift region, including a second alternating conductivity type layer formed of second n-type regions and second p-type regions arranged alternately, and a third alternating conductivity type layer formed of third n-type regions and third p-type regions arranged alternately. For preventing the charge imbalance from forming across the boundary between the drift region and the peripheral region, the impurity concentration and the pitch at which the n-type regions and the p-type regions repeat, of the first and second alternating conductivity type layers can be set at almost the same values, respectively. For relaxing the electric field in the peripheral portion of the drift region or in the peripheral region of the device, the third alternating conductivity type layer, which is doped more lightly than the first alternating conductivity type layer or the pitch thereof can be narrower than that of the first alternating conductivity type layer, can be formed in the surface portion of the periphery of the drift region or in the surface portion of the peripheral region of the device. The configurations according to the invention facilitate to relax the surface electric field and provide a vertical MOSFET exhibiting a higher breakdown voltage and a higher current capacity.

By doping the third alternating conductivity type layer more lightly than the second alternating conductivity type layer, the third alternating conductivity type layer can be depleted faster than the second alternating conductivity type layer in the off-state of the semiconductor device. Therefore, the surface electric field of the peripheral region can be suppressed and a higher breakdown voltage can be obtained.

By forming the first alternating conductivity type layer continuous or contiguous with the second alternating conductivity type layer, charge imbalance is not substantially formed across the boundary between the first and second alternating conductivity type layers. Therefore, the designed breakdown voltage can be secured easily.

By making the pitch of the third alternating conductivity type layer narrower than the pitch of the second alternating conductivity type layer, the third alternating conductivity type layer can be depleted faster than the second alternating conductivity type layer in the offstate of the semiconductor device. Therefore, the surface electric field of the peripheral region can be suppressed and a higher breakdown voltage can be obtained.

By extending the third alternating conductivity type layer below the peripheral portion of the active region, the electric field localization below the peripheral portion of the active region can be relaxed.

In the vertical MOSFET's, the active region is a switching region including a channel diffusion region for an inversion region on the side of the first major surface and a source region. In the bipolar transistors, the active region is a switching region including an emitter region or a collector region. The switching regions are active regions or passive regions having a function of selecting an electrically conductive state and an electrically nonconductive state on the first major surface side of the drift region. Therefore, the invention is applicable not only to the MOSFET's but also to the other semiconductor devices such as IGBT's, bipolar transistors, FWD's and Schottky diodes.

Given the disclosure of the present invention, one versed in the art would appreciate that there may be other embodiments and modifications within the scope and spirit of the present invention. Accordingly, all modifications and equivalents attainable by one versed in the art from the present disclosure within the scope and spirit of the present invention are to be included as further embodiments of the present invention. The scope of the present invention accordingly is to be defined as set forth in the appended claims.

The disclosure of the priority application, JP PA 2002-021596, in its entirety, including the drawings, claims, and the specification thereof, is incorporated herein by reference.

What is claimed is:

1. A semiconductor device comprising:
   a semiconductor chip having a first major surface and a second major surface facing opposite to the first major surface;
   an active region on the side of the first major surface for actively or passively making current flow;
   a layer with low electrical resistance of a first conductivity type, the layer with low electrical resistance being on the side of the second major surface;
   a drift region between the active region and the layer with low electrical resistance, the drift region providing a vertical drift current path in the ON-state of the semiconductor device, the drift region being depleted in the OFF-state of the semiconductor device;
   a peripheral region around the drift region, the peripheral region being between the first major surface and the layer with low electrical resistance, the peripheral region providing substantially no current path in the ON-state of the semiconductor device, the peripheral region being depleted in the OFF-state of the semiconductor device,
   wherein:
   the drift region comprises a first alternating conductivity type layer, which has first regions of the first conductivity type and first regions of a second conductivity type, with respective first regions extending perpendicular to the second major surface and arranged alternately and repeating at a first pitch parallel to the second major surface;

the peripheral region comprises a second alternating conductivity type layer, which has second regions of the first conductivity type and second regions of the second conductivity type, with respective second regions extending perpendicular to the second major surface and arranged alternately, repeating at the first pitch parallel to the second major surface, and the impurity concentration in the second alternating conductivity type layer is substantially the same as the impurity concentration in the first alternating conductivity type layer; and the peripheral region further comprises a third alternating conductivity type layer in the surface portion thereof on the side of the first major surface, the third alternating conductivity type layer having third regions of the first conductivity type and third regions of the second conductivity type, with respective third regions extending perpendicular to the second major surface and arranged alternately parallel to the second major surface, and the impurity concentration in the third alternating conductivity type layer is lower than the impurity concentration in the first alternating conductivity type layer.

2. The semiconductor device according to claim 1, wherein the first alternating conductivity type layer and the second alternating conductivity type layer are continuous with each other.

3. The semiconductor device according to claim 1, wherein the third alternating conductivity type layer is one half or less as thick as the first alternating conductivity type layer.

4. The semiconductor device according to claim 1, wherein the third alternating conductivity type layer is in contact with the first major surface.

5. The semiconductor device according to claim 4, wherein the third alternating conductivity type layer extends below the peripheral portion of the active region.

6. The semiconductor device according to claim 1, wherein the first regions of the first conductivity type, the first regions of the second conductivity type, the second regions of the first conductivity type, the second regions of the second conductivity type, the third regions of the first conductivity type, and the third regions of the second conductivity type are configured as stripes extending in a plane parallel to the second major surface.

7. The semiconductor device according to claim 6, wherein the direction in which the first regions of the first conductivity type and the first regions of the second conductivity type are arranged alternately is substantially parallel to or perpendicular to the direction in which the third regions of the first conductivity type and the third regions of the second conductivity type are arranged alternately.

8. The semiconductor device according to claim 6, wherein the direction in which the first regions of the first conductivity type and the first regions of the second conductivity type are arranged alternately is substantially parallel to the direction, in which the second regions of the first conductivity type and the second regions of the second conductivity type are arranged alternately.

9. The semiconductor device according to claim 1, further including a channel stopper region of the first conductivity type around the second alternating conductivity type layer and the third alternating conductivity type layer.

10. The semiconductor device according to claim 9, wherein the channel stopper region is connected to the layer with low electrical resistance.

11. The semiconductor device according to claim 1, further including an insulation film covering the third alternating conductivity type layer and a field plate covering at least the inner portion of the third alternating conductivity type layer with the insulation film interposed therebetween.

12. The semiconductor device according to claim 1, further including one or more rings of the second conductivity type around the active region and on the first major surface side of the third alternating conductivity type layer.

13. A semiconductor device comprising:

a semiconductor chip having a first major surface and a second major surface facing opposite to the first major surface;

an active region on the side of the first major surface for actively or passively making current flow;

a layer with low electrical resistance of a first conductivity type, the layer with low electrical resistance being on the side of the second major surface;

a drift region between the active region and the layer with low electrical resistance, the drift region providing a vertical drift current path in the ON-state of the semiconductor device, the drift region being depleted in the OFF-state of the semiconductor device;

a peripheral region around the drift region, the peripheral region being between the first major surface and the layer with low electrical resistance, the peripheral region providing substantially no current path in the ON-state of the semiconductor device, the peripheral region being depleted in the OFF-state of the semiconductor device, wherein:

the drift region comprises a first alternating conductivity type layer, which has first regions of the first conductivity type and first regions of a second conductivity type, with respective first regions extending perpendicular to the second major surface and arranged alternately and repeating at a first pitch parallel to the second major surface;

the peripheral region comprises a second alternating conductivity type layer, which has second regions of the first conductivity type and second regions of the second conductivity type, with respective second regions extending perpendicular to the second major surface and arranged alternately, repeating at the first pitch parallel to the second major surface, and the impurity concentration in the second alternating conductivity type layer is substantially the same as the impurity concentration in the first alternating conductivity type layer; and the peripheral region further comprises a third alternating conductivity type layer in the surface portion thereof on the side of the first major surface, the third alternating conductivity type layer having third regions of the first conductivity type and third regions of the second conductivity type, with respective third regions extending perpendicular to the second major surface and arranged alternately, repeating at a second pitch parallel to the second major surface, and the second pitch is narrower than the first pitch.

14. The semiconductor device according to claim 13, wherein the first alternating conductivity type layer and the second alternating conductivity type layer are continuous with each other.

15. The semiconductor device according to claim 13, wherein the impurity concentration in the third alternating conductivity type layer is lower than the impurity concentration in the first alternating conductivity type layer.

16. The semiconductor device according to claim 13, wherein the third alternating conductivity type layer is one half or less as thick as the first alternating conductivity type layer.

17. The semiconductor device according to claim 13, wherein the third alternating conductivity type layer is in contact with the first major surface.

18. The semiconductor device according to claim 17, wherein the third alternating conductivity type layer extends below the peripheral portion of the active region.

19. The semiconductor device according to claim 13, wherein the first regions of the first conductivity type, the first regions of the second conductivity type, the second regions of the first conductivity type, the second regions of the second conductivity type, the third regions of the first conductivity type, and the third regions of the second conductivity type are configured as stripes extending in a plane parallel to the second major surface.

20. The semiconductor device according to claim 19, wherein the direction in which the first regions of the first conductivity type and the first regions of the second conductivity type are arranged alternately is substantially parallel to or perpendicular to the direction in which the third regions of the first conductivity type and the third regions of the second conductivity type are arranged alternately.

21. The semiconductor device according to claim 19, wherein the direction in which the first regions of the first conductivity type and the first regions of the second conductivity type are arranged alternately is substantially parallel to the direction, in which the second regions of the first conductivity type and the second regions of the second conductivity type are arranged alternately.

22. The semiconductor device according to claim 13, further including a channel stopper region of the first conductivity type around the second alternating conductivity type layer and the third alternating conductivity type layer.

23. The semiconductor device according to claim 22, wherein the channel stopper region is connected to the layer with low electrical resistance.

24. The semiconductor device according to claim 13, further including an insulation film covering the third alternating conductivity type layer and a field plate covering at least the inner portion of the third alternating conductivity type layer with the insulation film interposed therebetween.

25. The semiconductor device according to claim 13, further including one or more rings of the second conductivity type around the active region and on the first major surface side of the third alternating conductivity type layer.

26. A semiconductor device comprising:
a semiconductor chip having a first major surface and a second major surface facing opposite to the first major surface;
an active region on the side of the first major surface for actively or passively making current flow;
a layer with low electrical resistance of a first conductivity type, the layer with low electrical resistance being on the side of the second major surface;
a drift region between the active region and the layer with low electrical resistance, the drift region providing a vertical drift current path in the ON-state of the semiconductor device, the drift region being depleted in the OFF-state of the semiconductor device;
a peripheral region around the drift region, the peripheral region being between the first major surface and the layer with low electrical resistance, the peripheral region providing substantially no current path in the ON-state of the semiconductor device, the peripheral region being depleted in the OFF-state of the semiconductor device, wherein:
the drift region comprises a first alternating conductivity type layer, which has a first region of the first conductivity type and first regions of the second conductivity type configured as columns standing on lattice points of a first planar polygonal lattice and repeating at a first pitch, the first region of the first conductivity type surrounding the first regions of the second conductivity type;
the peripheral region comprises a second alternating conductivity type layer, which has a second region of the first conductivity type and second regions of the second conductivity type configured as columns standing on the lattice points of the first planar polygonal lattice and repeating at a first pitch, the second region of the first conductivity type surrounding the second regions of the second conductivity type, and the impurity concentration in the second alternating conductivity type layer is substantially the same as the impurity concentration in the first alternating conductivity type layer; and
the peripheral region further comprises a third alternating conductivity type layer in the surface portion thereof on the side of the first major surface, the third alternating conductivity type layer having a third region of the first conductivity type and third regions of the second conductivity type configured as columns standing on the lattice points of a second planar polygonal lattice and repeating at a second pitch, the third region of the first conductivity type surrounding the third regions of the second conductivity type, and the second pitch is narrower than the first pitch.

27. The semiconductor device according to claim 26, wherein the first alternating conductivity type layer and the second alternating conductivity type layer are continuous with each other.

28. The semiconductor device according to claim 26, wherein the impurity concentration in the third alternating conductivity type layer is lower than the impurity concentration in the first alternating conductivity type layer.

29. The semiconductor device according to claim 26, wherein the third alternating conductivity type layer is one half or less as thick as the first alternating conductivity type layer.

30. The semiconductor device according to claim 26, wherein the third alternating conductivity type layer is in contact with the first major surface.

31. The semiconductor device according to claim 30, wherein the third alternating conductivity type layer extends below the peripheral portion of the active region.

32. The semiconductor device according to claim 26, further including a channel stopper region of the first conductivity type around the second alternating conductivity type layer and the third alternating conductivity type layer.

33. The semiconductor device according to claim 32, wherein the channel stopper region is connected to the layer with low electrical resistance.

34. The semiconductor device according to claim 26, further including an insulation film covering the third alternating conductivity type layer and a field plate covering at least the inner portion of the third alternating conductivity type layer with the insulation film interposed therebetween.

35. The semiconductor device according to claim 26, further including one or more rings of the second conductivity type around the active region and on the first major surface side of the third alternating conductivity type layer.

* * * * *